United States Patent
Giuliano

(10) Patent No.: US 12,438,135 B2
(45) Date of Patent: Oct. 7, 2025

(54) MULTILAYER POWER, CONVERTER WITH DEVICES HAVING REDUCED LATERAL CURRENT

(71) Applicant: pSemi Corporation, San Diego, CA (US)

(72) Inventor: David Giuliano, Bedford, NH (US)

(73) Assignee: pSemi Corporation, San Diego, CA (US)

(*) Notice: Subject to any disclaimer, the term of this patent is extended or adjusted under 35 U.S.C. 154(b) by 0 days.

(21) Appl. No.: 18/432,387

(22) Filed: Feb. 5, 2024

(65) Prior Publication Data

US 2024/0363604 A1    Oct. 31, 2024

Related U.S. Application Data

(60) Continuation of application No. 17/452,275, filed on Oct. 26, 2021, now Pat. No. 11,908,844, which is a
(Continued)

(51) Int. Cl.
*H01L 25/16* (2023.01)
*H01L 23/48* (2006.01)
(Continued)

(52) U.S. Cl.
CPC ............ *H01L 25/16* (2013.01); *H01L 23/481* (2013.01); *H01L 23/5223* (2013.01);
(Continued)

(58) Field of Classification Search
CPC ... H01L 25/16; H01L 23/481; H01L 23/5223; H01L 23/5227; H01L 23/64;
(Continued)

(56) References Cited

U.S. PATENT DOCUMENTS

| | | |
|---|---|---|
| 3,370,215 A | 2/1968 | Light, Jr. |
| 3,745,437 A | 7/1973 | Brown |

(Continued)

FOREIGN PATENT DOCUMENTS

| | | |
|---|---|---|
| CN | 1057410 A | 1/1992 |
| CN | 1132959 A | 10/1996 |

(Continued)

OTHER PUBLICATIONS

Wood—"Design, Fabrication and Initial Results of a 2g Autonomous Glider" IEEE Industrial Electronics Society, pp. 1870-1877, Nov. 2005, Doc 7598.
(Continued)

*Primary Examiner* — John P. Dulka
(74) *Attorney, Agent, or Firm* — Haynes and Boone, LLP

(57) ABSTRACT

This disclosure relates to embodiments that include an apparatus that may comprise an integrated circuit including a plurality of switched-capacitor partitions configured to be coupled to a plurality of pump capacitors. The plurality of switched-capacitor partitions includes a first partition and a second partition. The first partition includes a first switch and a second switch. The second partition includes a third switch and a fourth switch. The first partition and the second partition are disposed substantially symmetric with respect to an axis.

20 Claims, 17 Drawing Sheets

Related U.S. Application Data continuation of application No. 16/558,679, filed on Sep. 3, 2019, now Pat. No. 11,183,490, which is a continuation of application No. 16/139,583, filed on Sep. 24, 2018, now Pat. No. 10,424,564, which is a continuation of application No. 15/277,056, filed on Sep. 27, 2016, now Pat. No. 10,083,947, which is a continuation of application No. 14/294,642, filed on Jun. 3, 2014, now Pat. No. 9,497,854, which is a division of application No. 13/654,113, filed on Oct. 17, 2012, now Pat. No. 8,743,553.

(60) Provisional application No. 61/548,360, filed on Oct. 18, 2011.

(51) Int. Cl.
| | |
|---|---|
| *H01L 23/522* | (2006.01) |
| *H01L 23/64* | (2006.01) |
| *H02M 3/07* | (2006.01) |
| *H05K 1/02* | (2006.01) |
| *H05K 1/11* | (2006.01) |
| *H10D 1/68* | (2025.01) |
| *H10D 86/85* | (2025.01) |
| *H10D 88/00* | (2025.01) |
| *H10N 19/00* | (2023.01) |

(52) U.S. Cl.
CPC .......... *H01L 23/5227* (2013.01); *H01L 23/64* (2013.01); *H01L 23/642* (2013.01); *H02M 3/07* (2013.01); *H05K 1/0298* (2013.01); *H05K 1/115* (2013.01); *H10D 1/68* (2025.01); *H10D 1/716* (2025.01); *H10D 86/85* (2025.01); *H10D 88/00* (2025.01); *H10N 19/00* (2023.02); *H01L 2224/0401* (2013.01); *H01L 2224/0554* (2013.01); *H01L 2224/0557* (2013.01); *H01L 2224/05572* (2013.01); *H01L 2224/16225* (2013.01); *H01L 2224/16265* (2013.01); *H01L 2924/19103* (2013.01); *H01L 2924/19104* (2013.01); *H01L 2924/19105* (2013.01); *H02M 3/077* (2021.05)

(58) Field of Classification Search
CPC . H01L 23/642; H01L 27/016; H01L 27/0688; H01L 28/40; H01L 28/90; H01L 2224/0401; H01L 2224/0554; H01L 2224/0557; H01L 2224/05572; H01L 2224/16225; H01L 2224/16265; H01L 2924/19103; H01L 2924/19104; H01L 2924/19105; H02M 3/07; H02M 3/077; H05K 1/0298; H05K 1/115; H10N 19/00
See application file for complete search history.

(56) References Cited

U.S. PATENT DOCUMENTS

| | | |
|---|---|---|
| 3,818,306 A | 6/1974 | Marini |
| 3,818,360 A | 6/1974 | Boutmy et al. |
| 4,214,174 A | 7/1980 | Dickson |
| 4,408,268 A | 10/1983 | Peters et al. |
| 4,415,959 A | 11/1983 | Vinciarelli |
| 4,513,364 A | 4/1985 | Nilssen |
| 4,604,584 A | 8/1986 | Kelley |
| 4,713,742 A | 12/1987 | Parsley |
| 4,812,961 A | 3/1989 | Essaff et al. |
| 4,903,181 A | 2/1990 | Seidel |
| 5,006,782 A | 4/1991 | Pelly |
| 5,057,986 A | 10/1991 | Henze et al. |
| 5,119,283 A | 6/1992 | Steigerwald et al. |
| 5,132,606 A | 7/1992 | Herbert |
| 5,132,895 A | 7/1992 | Kase |
| 5,159,539 A | 10/1992 | Koyama |
| 5,198,970 A | 3/1993 | Kawabata et al. |
| 5,268,832 A | 12/1993 | Kandatsu |
| 5,301,097 A | 4/1994 | McDaniel |
| 5,331,303 A | 7/1994 | Shiota |
| 5,345,376 A | 9/1994 | Nourbakhsh |
| 5,402,329 A | 3/1995 | Wittenbreder, Jr. |
| 5,548,206 A | 8/1996 | Soo |
| 5,557,193 A | 9/1996 | Kajimoto et al. |
| 5,563,779 A | 10/1996 | Cave et al. |
| 5,581,454 A | 12/1996 | Collins |
| 5,602,794 A | 2/1997 | Javanifard et al. |
| 5,610,807 A | 3/1997 | Kanda et al. |
| 5,661,348 A | 8/1997 | Brown |
| 5,717,581 A | 2/1998 | Canclini et al. |
| 5,737,201 A | 4/1998 | Meynard et al. |
| 5,761,058 A | 6/1998 | Kanda et al. |
| 5,793,626 A | 8/1998 | Jiang et al. |
| 5,801,987 A | 9/1998 | Dinh |
| 5,812,017 A | 9/1998 | Golla et al. |
| 5,831,846 A | 11/1998 | Jiang |
| 5,892,395 A | 4/1999 | Stengel et al. |
| 5,907,484 A | 5/1999 | Kowshik et al. |
| 5,956,243 A | 9/1999 | Mao |
| 5,959,565 A | 9/1999 | Taniuchi et al. |
| 5,959,585 A | 9/1999 | Militz |
| 5,978,283 A | 11/1999 | Hsu et al. |
| 5,982,645 A | 11/1999 | Levran et al. |
| 5,991,169 A | 11/1999 | Kooken et al. |
| 6,021,056 A | 2/2000 | Forbes et al. |
| 6,055,168 A | 4/2000 | Kotowski et al. |
| 6,084,789 A | 7/2000 | Van Lieshout |
| 6,107,864 A | 8/2000 | Fukushima et al. |
| 6,133,788 A | 10/2000 | Dent |
| 6,140,807 A | 10/2000 | Vannatta et al. |
| 6,154,380 A | 11/2000 | Assow et al. |
| 6,157,253 A | 12/2000 | Sigmon et al. |
| 6,169,457 B1 | 1/2001 | Ichimaru |
| 6,169,673 B1 | 1/2001 | McIntyrei et al. |
| 6,178,102 B1 | 1/2001 | Stanley et al. |
| 6,198,645 B1 | 3/2001 | Kotowski et al. |
| 6,255,896 B1 | 7/2001 | Li et al. |
| 6,255,906 B1 | 7/2001 | Eidson et al. |
| 6,275,018 B1 | 8/2001 | Telefus et al. |
| 6,316,956 B1 | 11/2001 | Oglesbee |
| 6,327,462 B1 | 12/2001 | Loke et al. |
| 6,329,796 B1 | 12/2001 | Popescu |
| 6,339,538 B1 | 1/2002 | Handleman |
| 6,362,986 B1 | 3/2002 | Schultz et al. |
| 6,377,117 B2 | 4/2002 | Oskowsky et al. |
| 6,396,341 B1 | 5/2002 | Pehlke |
| 6,400,579 B2 | 6/2002 | Cuk |
| 6,429,632 B1 | 8/2002 | Forbes et al. |
| 6,456,153 B2 | 9/2002 | Buck et al. |
| 6,476,666 B1 | 11/2002 | Palusa et al. |
| 6,486,728 B2 | 11/2002 | Kleveland |
| 6,501,325 B1 | 12/2002 | Meng |
| 6,504,422 B1 | 1/2003 | Rader et al. |
| 6,507,503 B2 | 1/2003 | Norrga |
| 6,515,612 B1 | 2/2003 | Abel |
| 6,563,235 B1 | 5/2003 | McIntyre et al. |
| 6,597,235 B2 | 7/2003 | Choi |
| 6,617,832 B1 | 9/2003 | Kobayashi |
| 6,650,552 B2 | 11/2003 | Takagi et al. |
| 6,657,876 B2 | 12/2003 | Satoh |
| 6,700,803 B2 | 3/2004 | Krein |
| 6,738,277 B2 | 5/2004 | Odell |
| 6,738,432 B2 | 5/2004 | Pehlke et al. |
| 6,759,766 B2 | 7/2004 | Hiratsuka et al. |
| 6,791,298 B2 | 9/2004 | Shenai et al. |
| 6,798,177 B1 | 9/2004 | Liu et al. |
| 6,906,567 B2 | 6/2005 | Culler |
| 6,927,441 B2 | 8/2005 | Pappalardo et al. |
| 6,934,167 B2 | 8/2005 | Jang et al. |
| 6,980,045 B1 | 12/2005 | Liu |
| 6,980,181 B2 | 12/2005 | Sudo |
| 6,995,995 B2 | 2/2006 | Zeng et al. |
| 7,009,858 B2 | 3/2006 | Umeda et al. |

(56) References Cited

U.S. PATENT DOCUMENTS

| | | |
|---|---|---|
| 7,071,660 B2 | 7/2006 | Xu et al. |
| 7,072,195 B2 | 7/2006 | Xu |
| 7,091,778 B2 | 8/2006 | Gan et al. |
| 7,103,114 B1 | 9/2006 | Lapierre |
| 7,135,847 B2 | 11/2006 | Taurand |
| 7,145,382 B2 | 12/2006 | Ker et al. |
| 7,157,956 B2 | 1/2007 | Wei |
| 7,161,816 B2 | 1/2007 | Shteynberg et al. |
| 7,190,210 B2 | 3/2007 | Azrai et al. |
| 7,224,062 B2 | 5/2007 | Hsu |
| 7,236,542 B2 | 6/2007 | Matero |
| 7,239,194 B2 | 7/2007 | Azrai et al. |
| 7,250,810 B1 | 7/2007 | Tsen |
| 7,259,974 B2 | 8/2007 | Donaldson et al. |
| 7,269,036 B2 | 9/2007 | Deng et al. |
| 7,330,070 B2 | 2/2008 | Vaisanen |
| 7,362,251 B2 | 4/2008 | Jensen et al. |
| 7,365,523 B2 | 4/2008 | Malherbe et al. |
| 7,375,992 B2 | 5/2008 | Mok et al. |
| 7,382,113 B2 | 6/2008 | Wai et al. |
| 7,382,634 B2 | 6/2008 | Buchmann |
| 7,397,677 B1 | 7/2008 | Collins et al. |
| 7,400,118 B1 | 7/2008 | Zhang et al. |
| 7,408,330 B1 | 8/2008 | Zhao |
| 7,436,239 B2 | 10/2008 | Masuko et al. |
| 7,443,705 B2 | 10/2008 | Ito |
| 7,511,978 B2 | 3/2009 | Chen et al. |
| 7,521,914 B2 | 4/2009 | Dickerson et al. |
| 7,535,133 B2 | 5/2009 | Perreault et al. |
| 7,545,127 B2 | 6/2009 | Takahashi et al. |
| 7,589,605 B2 | 9/2009 | Perreault et al. |
| 7,595,682 B2 | 9/2009 | Lin et al. |
| 7,595,683 B1 | 9/2009 | Floyd |
| 7,616,467 B2 | 11/2009 | Mallwitz |
| 7,633,778 B2 | 12/2009 | Mok et al. |
| 7,642,797 B2 | 1/2010 | Kojima et al. |
| 7,656,740 B2 | 2/2010 | Yu et al. |
| 7,659,760 B2 | 2/2010 | Doi |
| 7,679,429 B2 | 3/2010 | Nakamura |
| 7,679,430 B2 | 3/2010 | Fort et al. |
| 7,696,735 B2 | 4/2010 | Oraw et al. |
| 7,705,672 B1 | 4/2010 | Rodriguez |
| 7,705,681 B2 | 4/2010 | Ilkov |
| 7,724,551 B2 | 5/2010 | Yanagida et al. |
| 7,746,041 B2 | 6/2010 | Xu et al. |
| 7,768,800 B2 | 8/2010 | Mazumder et al. |
| 7,777,459 B2 | 8/2010 | Williams |
| 7,782,027 B2 | 8/2010 | Williams |
| 7,786,712 B2 | 8/2010 | Peng et al. |
| 7,807,499 B2 | 10/2010 | Nishizawa |
| 7,808,324 B1 | 10/2010 | Woodford et al. |
| 7,812,579 B2 | 10/2010 | Williams |
| 7,889,519 B2 | 2/2011 | Perreault et al. |
| 7,907,429 B2 | 3/2011 | Ramadass et al. |
| 7,907,430 B2 | 3/2011 | Kularatna et al. |
| 7,928,705 B2 | 4/2011 | Hooijschuur et al. |
| 7,940,038 B2 | 5/2011 | Lin et al. |
| 7,944,276 B2 | 5/2011 | Nakai et al. |
| 7,952,418 B2 | 5/2011 | McDonald et al. |
| 7,956,572 B2 | 6/2011 | Kramer et al. |
| 7,956,673 B2 | 6/2011 | Pan |
| 7,977,921 B2 | 7/2011 | Bahai et al. |
| 7,977,927 B2 | 7/2011 | Williams |
| 7,999,601 B2 | 8/2011 | Schlueter et al. |
| 8,000,117 B2 | 8/2011 | Petricek |
| 8,018,216 B2 | 9/2011 | Kakehi |
| 8,026,763 B2 | 9/2011 | Dawson et al. |
| 8,031,003 B2 | 10/2011 | Dishop |
| 8,035,148 B2 | 10/2011 | Goldstein et al. |
| 8,040,174 B2 | 10/2011 | Likhterov |
| 8,048,766 B2 | 11/2011 | Joly et al. |
| 8,076,915 B2 | 12/2011 | Nakazawa |
| 8,085,524 B2 | 12/2011 | Roozeboom et al. |
| 8,089,788 B2 | 1/2012 | Jain |
| 8,102,157 B2 | 1/2012 | Abe |
| 8,106,597 B2 | 1/2012 | Mednik et al. |
| 8,111,052 B2 | 2/2012 | Glovinsky |
| 8,111,054 B2 | 2/2012 | Yen et al. |
| 8,130,518 B2 | 3/2012 | Fishman |
| 8,154,333 B2 | 4/2012 | Ker et al. |
| 8,159,091 B2 | 4/2012 | Yeates |
| 8,164,369 B2 | 4/2012 | Raghunathan et al. |
| 8,164,384 B2 | 4/2012 | Dawson et al. |
| 8,169,797 B2 | 5/2012 | Coccia et al. |
| 8,193,604 B2 | 6/2012 | Lin et al. |
| 8,212,541 B2 | 7/2012 | Perreault et al. |
| 8,214,900 B1 | 7/2012 | Arkiszewski et al. |
| 8,248,045 B2 | 8/2012 | Shiu |
| 8,248,054 B2 | 8/2012 | Tong |
| 8,274,322 B2 | 9/2012 | Chang et al. |
| 8,276,002 B2 | 9/2012 | Dennard et al. |
| 8,330,436 B2 | 12/2012 | Oraw et al. |
| 8,339,102 B2 | 12/2012 | Kushnarenko et al. |
| 8,339,184 B2 | 12/2012 | Kok et al. |
| 8,350,549 B2 | 1/2013 | Kitabatake |
| 8,354,828 B2 | 1/2013 | Huang et al. |
| 8,384,467 B1 | 2/2013 | O'Keeffe et al. |
| 8,395,914 B2 | 3/2013 | Klootwijk et al. |
| 8,423,800 B2 | 4/2013 | Huang et al. |
| 8,436,674 B1 | 5/2013 | Standley et al. |
| 8,451,053 B2 | 5/2013 | Perreault et al. |
| 8,456,874 B2 | 6/2013 | Singer et al. |
| 8,503,203 B1 | 8/2013 | Szczeszynski et al. |
| 8,515,361 B2 | 8/2013 | Levesque et al. |
| 8,538,355 B2 | 9/2013 | Stockert |
| 8,542,061 B2 | 9/2013 | Levesque et al. |
| 8,542,169 B2 | 9/2013 | Jain |
| 8,559,898 B2 | 10/2013 | Jones et al. |
| 8,565,694 B2 | 10/2013 | Jones et al. |
| 8,571,492 B2 | 10/2013 | Berchtold et al. |
| 8,582,333 B2 | 11/2013 | Oraw et al. |
| 8,619,443 B2 | 12/2013 | Lumsden |
| 8,619,445 B1 | 12/2013 | Low et al. |
| 8,629,666 B2 | 1/2014 | Carroll et al. |
| 8,643,347 B2 | 2/2014 | Giuliano et al. |
| 8,659,353 B2 | 2/2014 | Dawson et al. |
| 8,670,254 B2 | 3/2014 | Perreault et al. |
| 8,674,545 B2 | 3/2014 | Signorelli et al. |
| 8,693,224 B1 | 4/2014 | Giuliano |
| 8,699,248 B2 | 4/2014 | Giuliano et al. |
| 8,699,973 B2 | 4/2014 | Southcombe et al. |
| 8,706,063 B2 | 4/2014 | Honjo et al. |
| 8,712,349 B2 | 4/2014 | Southcombe et al. |
| 8,718,188 B2 | 5/2014 | Balteanu et al. |
| 8,723,491 B2 | 5/2014 | Giuliano |
| 8,724,353 B1 | 5/2014 | Giuliano et al. |
| 8,729,819 B2 | 5/2014 | Zhao et al. |
| 8,731,498 B2 | 5/2014 | Southcombe et al. |
| 8,737,093 B1 | 5/2014 | Baker et al. |
| 8,743,553 B2 | 6/2014 | Giuliano |
| 8,750,539 B2 | 6/2014 | Pennock et al. |
| 8,760,219 B2 | 6/2014 | Chao |
| 8,803,492 B2 | 8/2014 | Liu |
| 8,811,920 B2 | 8/2014 | Deuchars et al. |
| 8,811,921 B2 | 8/2014 | Jones et al. |
| 8,817,501 B1 | 8/2014 | Low et al. |
| 8,824,978 B2 | 9/2014 | Briffa et al. |
| 8,829,993 B2 | 9/2014 | Briffa et al. |
| 8,830,709 B2 | 9/2014 | Perreault |
| 8,830,710 B2 | 9/2014 | Perreault et al. |
| 8,831,544 B2 | 9/2014 | Walker et al. |
| 8,842,399 B2 | 9/2014 | Jones et al. |
| 8,854,019 B1 | 10/2014 | Levesque et al. |
| 8,854,849 B2 | 10/2014 | Kobeda |
| 8,856,562 B2 | 10/2014 | Huang et al. |
| 8,860,396 B2 | 10/2014 | Giuliano |
| 8,867,281 B2 | 10/2014 | Tran et al. |
| 8,874,828 B2 | 10/2014 | Fai et al. |
| 8,891,258 B2 | 11/2014 | Zhang et al. |
| 8,892,063 B2 | 11/2014 | Jones et al. |
| 8,913,967 B2 | 12/2014 | Zimlich et al. |
| 8,913,971 B2 | 12/2014 | Arkiszewski et al. |
| 8,942,650 B2 | 1/2015 | Southcombe et al. |
| 8,942,651 B2 | 1/2015 | Jones et al. |

(56) References Cited

U.S. PATENT DOCUMENTS

| | | |
|---|---|---|
| 8,947,157 B2 | 2/2015 | Levesque et al. |
| 8,957,727 B2 | 2/2015 | Dawson et al. |
| 8,958,763 B2 | 2/2015 | Williams et al. |
| 8,981,836 B2 | 3/2015 | Kern et al. |
| 8,983,407 B2 | 3/2015 | Southcombe et al. |
| 8,983,409 B2 | 3/2015 | Ngo et al. |
| 8,983,410 B2 | 3/2015 | Southcombe et al. |
| 8,989,685 B2 | 3/2015 | Southcombe et al. |
| 9,008,597 B2 | 4/2015 | Levesque et al. |
| 9,030,256 B2 | 5/2015 | Jones et al. |
| 9,041,459 B2 | 5/2015 | Szczeszynski et al. |
| 9,048,787 B2 | 6/2015 | Jones et al. |
| 9,077,405 B2 | 7/2015 | Jones et al. |
| 9,143,032 B2 | 9/2015 | Le et al. |
| 9,143,037 B2 | 9/2015 | Giuliano |
| 9,184,701 B2 | 11/2015 | Berchtold et al. |
| 9,203,299 B2 | 12/2015 | Low et al. |
| 9,209,758 B2 | 12/2015 | Briffa et al. |
| 9,209,787 B2 | 12/2015 | Shelton et al. |
| 9,214,865 B2 | 12/2015 | Levesque et al. |
| 9,350,234 B2 | 5/2016 | Verma |
| 9,362,825 B2 | 6/2016 | Southcombe et al. |
| 9,362,826 B2 | 6/2016 | Giuliano |
| 9,374,001 B1 | 6/2016 | Subramaniam et al. |
| 9,413,257 B2 | 8/2016 | Wang et al. |
| 9,444,329 B2 | 9/2016 | Arno et al. |
| 9,450,506 B2 | 9/2016 | Perreault et al. |
| 9,497,854 B2 | 11/2016 | Giuliano |
| 9,502,968 B2 | 11/2016 | Giuliano et al. |
| 9,553,550 B2 | 1/2017 | Puliafico et al. |
| 9,577,590 B2 | 2/2017 | Levesque et al. |
| 9,584,024 B2 | 2/2017 | Manthe et al. |
| 9,601,998 B2 | 3/2017 | Le et al. |
| 9,621,138 B1 | 4/2017 | Zhang et al. |
| 9,634,577 B2 | 4/2017 | Perreault |
| 9,640,445 B1 | 5/2017 | Hwang |
| 9,712,051 B2 | 7/2017 | Giuliano |
| 9,722,492 B2 | 8/2017 | Levesque et al. |
| 9,742,266 B2 | 8/2017 | Giuliano et al. |
| 9,755,672 B2 | 9/2017 | Perreault et al. |
| 9,819,283 B2 | 11/2017 | Mahdavikhah et al. |
| 9,847,712 B2 | 12/2017 | Low et al. |
| 9,847,715 B2 | 12/2017 | Giuliano et al. |
| 9,882,471 B2 | 1/2018 | Giuliano |
| 9,899,919 B2 | 2/2018 | Crossley et al. |
| 9,900,204 B2 | 2/2018 | Levesque et al. |
| 10,083,947 B2 | 9/2018 | Giuliano |
| 10,243,457 B2 | 3/2019 | Puggelli et al. |
| 10,263,512 B2 | 4/2019 | Giuliano et al. |
| 10,274,987 B2 | 4/2019 | Puggelli et al. |
| 10,326,358 B2 | 6/2019 | Giuliano |
| 10,355,593 B1 | 7/2019 | Puggelli et al. |
| 10,374,512 B2 | 8/2019 | Szczeszynski et al. |
| 10,381,924 B2 | 8/2019 | Giuliano |
| 10,389,235 B2 | 8/2019 | Giuliano |
| 10,389,244 B2 | 8/2019 | Le et al. |
| 10,404,162 B2 | 9/2019 | Giuliano |
| 10,411,490 B2 | 9/2019 | Melgar et al. |
| 10,424,564 B2 * | 9/2019 | Giuliano ............... H05K 1/115 |
| 10,523,039 B2 | 12/2019 | Melgar et al. |
| 10,541,603 B2 | 1/2020 | Puggelli et al. |
| 10,601,311 B2 | 3/2020 | Meyvaert et al. |
| 10,644,590 B2 | 5/2020 | Giuliano et al. |
| 10,666,134 B2 | 5/2020 | Low et al. |
| 10,673,335 B2 | 6/2020 | Le et al. |
| 10,680,515 B2 | 6/2020 | Giuliano |
| 10,686,380 B2 | 6/2020 | Giuliano |
| 10,715,035 B2 | 7/2020 | Li et al. |
| 10,720,832 B2 | 7/2020 | Meyvaert et al. |
| 10,770,976 B2 | 9/2020 | Giuliano et al. |
| 10,833,579 B1 | 11/2020 | Puggelli et al. |
| 11,264,895 B2 | 3/2022 | Giuliano et al. |
| 11,342,844 B1 | 5/2022 | Meyvaert |
| 11,515,784 B2 | 11/2022 | Meyvaert et al. |
| 2002/0008567 A1 | 1/2002 | Henry |
| 2002/0060914 A1 | 5/2002 | Porter et al. |
| 2002/0130704 A1 | 9/2002 | Myono et al. |
| 2002/0158660 A1 | 10/2002 | Jang et al. |
| 2003/0038669 A1 | 2/2003 | Zhang |
| 2003/0058665 A1 | 3/2003 | Kobayashi et al. |
| 2003/0151449 A1 | 8/2003 | Nakagawa et al. |
| 2003/0169096 A1 | 9/2003 | Hsu et al. |
| 2003/0169896 A1 | 9/2003 | Kirk, III et al. |
| 2003/0227280 A1 | 12/2003 | Vinciarelli |
| 2004/0041620 A1 | 3/2004 | D'Angelo et al. |
| 2004/0080964 A1 | 4/2004 | Buchmann |
| 2004/0095787 A1 | 5/2004 | Donaldson et al. |
| 2004/0170030 A1 | 9/2004 | Duerbaum et al. |
| 2004/0222775 A1 | 11/2004 | Muramatsu et al. |
| 2004/0246044 A1 | 12/2004 | Myono et al. |
| 2005/0007184 A1 | 1/2005 | Kamijo |
| 2005/0024125 A1 | 2/2005 | McNitt et al. |
| 2005/0068073 A1 | 3/2005 | Shi et al. |
| 2005/0088865 A1 | 4/2005 | Lopez et al. |
| 2005/0102798 A1 | 5/2005 | Kato |
| 2005/0136873 A1 | 6/2005 | Kim et al. |
| 2005/0169021 A1 | 8/2005 | Itoh |
| 2005/0207133 A1 | 9/2005 | Pavier et al. |
| 2005/0213267 A1 | 9/2005 | Azrai et al. |
| 2005/0254272 A1 | 11/2005 | Vinciarelli et al. |
| 2005/0285767 A1 | 12/2005 | Wang et al. |
| 2005/0286278 A1 | 12/2005 | Perreault et al. |
| 2006/0139021 A1 | 6/2006 | Taurand |
| 2006/0153495 A1 | 7/2006 | Wynne |
| 2006/0186947 A1 | 8/2006 | Lin et al. |
| 2006/0213890 A1 | 9/2006 | Kooken et al. |
| 2006/0226130 A1 | 10/2006 | Kooken et al. |
| 2007/0018700 A1 | 1/2007 | Yen et al. |
| 2007/0035973 A1 | 2/2007 | Kitazaki et al. |
| 2007/0035977 A1 | 2/2007 | Odell et al. |
| 2007/0051712 A1 | 3/2007 | Kooken et al. |
| 2007/0066224 A1 | 3/2007 | d'Hont et al. |
| 2007/0066250 A1 | 3/2007 | Takahashi et al. |
| 2007/0069818 A1 | 3/2007 | Bhatti et al. |
| 2007/0091655 A1 | 4/2007 | Oyama et al. |
| 2007/0123184 A1 | 5/2007 | Nesimoglu et al. |
| 2007/0146020 A1 | 6/2007 | Williams |
| 2007/0146052 A1 | 6/2007 | Byeon et al. |
| 2007/0146090 A1 | 6/2007 | Carey et al. |
| 2007/0159257 A1 | 7/2007 | Lee et al. |
| 2007/0171680 A1 | 7/2007 | Perreault et al. |
| 2007/0182368 A1 | 8/2007 | Yang et al. |
| 2007/0210774 A1 | 9/2007 | Kimura et al. |
| 2007/0230221 A1 | 10/2007 | Lim et al. |
| 2007/0247222 A1 | 10/2007 | Sorrells et al. |
| 2007/0247253 A1 | 10/2007 | Carey et al. |
| 2007/0281635 A1 | 12/2007 | McCallister et al. |
| 2007/0290747 A1 | 12/2007 | Traylor et al. |
| 2007/0291718 A1 | 12/2007 | Chan et al. |
| 2007/0296383 A1 | 12/2007 | Xu et al. |
| 2008/0001660 A1 | 1/2008 | Ramadass |
| 2008/0003960 A1 | 1/2008 | Zolfaghari et al. |
| 2008/0003962 A1 | 1/2008 | Ngai |
| 2008/0007333 A1 | 1/2008 | Lee et al. |
| 2008/0008273 A1 | 1/2008 | Kim et al. |
| 2008/0009248 A1 | 1/2008 | Rozenblit et al. |
| 2008/0012637 A1 | 1/2008 | Aridas et al. |
| 2008/0013236 A1 | 1/2008 | Weng |
| 2008/0019459 A1 | 1/2008 | Chen et al. |
| 2008/0024198 A1 | 1/2008 | Bitonti et al. |
| 2008/0031023 A1 | 2/2008 | Kitagawa et al. |
| 2008/0051044 A1 | 2/2008 | Takehara |
| 2008/0055946 A1 | 3/2008 | Lesso et al. |
| 2008/0062724 A1 | 3/2008 | Feng et al. |
| 2008/0136500 A1 | 6/2008 | Frulio et al. |
| 2008/0136559 A1 | 6/2008 | Takahashi et al. |
| 2008/0136991 A1 | 6/2008 | Senda |
| 2008/0150619 A1 | 6/2008 | Lesso et al. |
| 2008/0150621 A1 | 6/2008 | Lesso et al. |
| 2008/0157732 A1 | 7/2008 | Williams |
| 2008/0157733 A1 | 7/2008 | Williams et al. |
| 2008/0158915 A1 | 7/2008 | Williams |
| 2008/0186081 A1 | 8/2008 | Yamahira et al. |
| 2008/0231233 A1 | 9/2008 | Thornton |

(56) References Cited

U.S. PATENT DOCUMENTS

| | | |
|---|---|---|
| 2008/0233913 A1 | 9/2008 | Sivasubramaniam |
| 2008/0239772 A1 | 10/2008 | Oraw et al. |
| 2008/0266917 A1 | 10/2008 | Lin et al. |
| 2008/0284398 A1 | 11/2008 | Qiu et al. |
| 2009/0004981 A1 | 1/2009 | Eliezer et al. |
| 2009/0033289 A1 | 2/2009 | Xing et al. |
| 2009/0033293 A1 | 2/2009 | Xing et al. |
| 2009/0039843 A1 | 2/2009 | Kudo |
| 2009/0059630 A1 | 3/2009 | Williams et al. |
| 2009/0066407 A1 | 3/2009 | Bowman et al. |
| 2009/0072800 A1 | 3/2009 | Ramadass et al. |
| 2009/0102439 A1 | 4/2009 | Williams |
| 2009/0147554 A1 | 6/2009 | Adest et al. |
| 2009/0174383 A1 | 7/2009 | Tsui et al. |
| 2009/0176464 A1 | 7/2009 | Liang et al. |
| 2009/0196082 A1 | 8/2009 | Mazumder et al. |
| 2009/0206804 A1 | 8/2009 | Xu et al. |
| 2009/0225012 A1 | 9/2009 | Choi |
| 2009/0230934 A1 | 9/2009 | Hooijschuur et al. |
| 2009/0257211 A1 | 10/2009 | Kontani et al. |
| 2009/0273955 A1 | 11/2009 | Tseng et al. |
| 2009/0278520 A1* | 11/2009 | Perreault ............... H02M 3/07 323/282 |
| 2009/0302686 A1 | 12/2009 | Fishman |
| 2009/0303753 A1 | 12/2009 | Fu et al. |
| 2009/0309566 A1 | 12/2009 | Shiu |
| 2009/0311980 A1 | 12/2009 | Sjoland et al. |
| 2009/0322304 A1 | 12/2009 | Oraw et al. |
| 2009/0322414 A1 | 12/2009 | Oraw et al. |
| 2009/0323380 A1 | 12/2009 | Harrison |
| 2010/0013548 A1 | 1/2010 | Barrow |
| 2010/0027596 A1 | 2/2010 | Bellaouar et al. |
| 2010/0060326 A1 | 3/2010 | Palmer et al. |
| 2010/0073084 A1 | 3/2010 | Hur et al. |
| 2010/0085786 A1 | 4/2010 | Chiu et al. |
| 2010/0097104 A1 | 4/2010 | Yang et al. |
| 2010/0110741 A1 | 5/2010 | Lin et al. |
| 2010/0117612 A1 | 5/2010 | Klootwijk et al. |
| 2010/0117700 A1 | 5/2010 | Raghunathan et al. |
| 2010/0117719 A1 | 5/2010 | Matano |
| 2010/0118458 A1 | 5/2010 | Coffey |
| 2010/0120475 A1 | 5/2010 | Taniuchi et al. |
| 2010/0123447 A1 | 5/2010 | Vecera et al. |
| 2010/0140736 A1 | 6/2010 | Lin et al. |
| 2010/0142239 A1 | 6/2010 | Hopper |
| 2010/0156370 A1 | 6/2010 | Tseng et al. |
| 2010/0164579 A1 | 7/2010 | Acatrinei |
| 2010/0176869 A1 | 7/2010 | Horie et al. |
| 2010/0201441 A1 | 8/2010 | Gustavsson |
| 2010/0202161 A1 | 8/2010 | Sims et al. |
| 2010/0205614 A1 | 8/2010 | Harrington |
| 2010/0214746 A1 | 8/2010 | Lotfi et al. |
| 2010/0237833 A1 | 9/2010 | Abe et al. |
| 2010/0244189 A1 | 9/2010 | Klootwijk et al. |
| 2010/0244585 A1 | 9/2010 | Tan et al. |
| 2010/0244935 A1 | 9/2010 | Kim et al. |
| 2010/0276572 A1 | 11/2010 | Iwabuchi |
| 2010/0291888 A1 | 11/2010 | Hadjichristos et al. |
| 2010/0308751 A1 | 12/2010 | Nerone |
| 2010/0321041 A1 | 12/2010 | Feldtkeller et al. |
| 2011/0001542 A1 | 1/2011 | Ranta et al. |
| 2011/0026275 A1 | 2/2011 | Huang et al. |
| 2011/0050325 A1 | 3/2011 | Schatzberger et al. |
| 2011/0051476 A1 | 3/2011 | Manor et al. |
| 2011/0062940 A1 | 3/2011 | Shvartsman |
| 2011/0089483 A1 | 4/2011 | Reynes et al. |
| 2011/0101884 A1 | 5/2011 | Kim et al. |
| 2011/0101938 A1 | 5/2011 | Ma et al. |
| 2011/0115550 A1 | 5/2011 | Pelley |
| 2011/0148385 A1 | 6/2011 | North et al. |
| 2011/0148518 A1 | 6/2011 | Lejon et al. |
| 2011/0156819 A1 | 6/2011 | Kim et al. |
| 2011/0163414 A1 | 7/2011 | Lin et al. |
| 2011/0175591 A1 | 7/2011 | Cuk |
| 2011/0176335 A1 | 7/2011 | Li et al. |
| 2011/0181115 A1 | 7/2011 | Ivanov |
| 2011/0181128 A1 | 7/2011 | Perreault et al. |
| 2011/0204724 A1 | 8/2011 | Verma |
| 2011/0204858 A1 | 8/2011 | Kudo |
| 2011/0216561 A1* | 9/2011 | Bayerer ............... H01L 25/162 363/71 |
| 2011/0236766 A1 | 9/2011 | Kolosnitsyn et al. |
| 2011/0241767 A1 | 10/2011 | Curatola et al. |
| 2011/0273151 A1 | 11/2011 | Lesso et al. |
| 2011/0304310 A1 | 12/2011 | Sotono et al. |
| 2012/0014153 A1 | 1/2012 | Christoph et al. |
| 2012/0043818 A1 | 2/2012 | Stratakos et al. |
| 2012/0050137 A1 | 3/2012 | Hellenthal et al. |
| 2012/0064953 A1 | 3/2012 | Dagher et al. |
| 2012/0075891 A1 | 3/2012 | Zhang et al. |
| 2012/0105137 A1 | 5/2012 | Kok et al. |
| 2012/0119718 A1 | 5/2012 | Song |
| 2012/0126909 A1 | 5/2012 | McCune, Jr. |
| 2012/0139515 A1 | 6/2012 | Li |
| 2012/0146177 A1 | 6/2012 | Choi et al. |
| 2012/0146451 A1 | 6/2012 | Nitta |
| 2012/0153907 A1 | 6/2012 | Carobolante et al. |
| 2012/0153912 A1 | 6/2012 | Demski et al. |
| 2012/0154023 A1 | 6/2012 | Pan et al. |
| 2012/0158188 A1 | 6/2012 | Madala |
| 2012/0170334 A1 | 7/2012 | Menegoli et al. |
| 2012/0176195 A1 | 7/2012 | Dawson et al. |
| 2012/0200340 A1 | 8/2012 | Shook et al. |
| 2012/0212201 A1 | 8/2012 | Lee et al. |
| 2012/0223773 A1 | 9/2012 | Jones et al. |
| 2012/0243267 A1 | 9/2012 | Kassayan |
| 2012/0249096 A1 | 10/2012 | Enenkel |
| 2012/0249224 A1 | 10/2012 | Wei et al. |
| 2012/0250360 A1 | 10/2012 | Orr et al. |
| 2012/0252382 A1 | 10/2012 | Bashir et al. |
| 2012/0268030 A1 | 10/2012 | Riesebosch |
| 2012/0313602 A1 | 12/2012 | Perreault et al. |
| 2012/0326684 A1 | 12/2012 | Perreault et al. |
| 2013/0005286 A1 | 1/2013 | Chan et al. |
| 2013/0044519 A1 | 2/2013 | Teraura et al. |
| 2013/0049714 A1 | 2/2013 | Chiu |
| 2013/0049885 A1 | 2/2013 | Rozman et al. |
| 2013/0058049 A1 | 3/2013 | Roth et al. |
| 2013/0058141 A1 | 3/2013 | Oraw et al. |
| 2013/0069614 A1 | 3/2013 | Tso et al. |
| 2013/0094157 A1 | 4/2013 | Giuliano |
| 2013/0106380 A1 | 5/2013 | Marsili et al. |
| 2013/0147543 A1 | 6/2013 | Dai |
| 2013/0154491 A1 | 6/2013 | Hawley |
| 2013/0154600 A1 | 6/2013 | Giuliano |
| 2013/0163302 A1 | 6/2013 | Li et al. |
| 2013/0163392 A1 | 6/2013 | Braunberger |
| 2013/0181521 A1 | 7/2013 | Khlat |
| 2013/0187612 A1 | 7/2013 | Aiura et al. |
| 2013/0201729 A1 | 8/2013 | Ahsanuzzaman et al. |
| 2013/0229841 A1 | 9/2013 | Giuliano |
| 2013/0234785 A1 | 9/2013 | Dai |
| 2013/0241625 A1 | 9/2013 | Perreault et al. |
| 2013/0245487 A1 | 9/2013 | Aga |
| 2013/0279224 A1 | 10/2013 | Ofek |
| 2013/0287231 A1 | 10/2013 | Kropfitsch |
| 2013/0293310 A1 | 11/2013 | Levesque et al. |
| 2013/0313904 A1 | 11/2013 | Kayama |
| 2013/0322126 A1 | 12/2013 | Pan et al. |
| 2013/0343106 A1 | 12/2013 | Perreault et al. |
| 2013/0343107 A1 | 12/2013 | Perreault |
| 2014/0015731 A1 | 1/2014 | Khlat et al. |
| 2014/0022005 A1 | 1/2014 | Ramanan et al. |
| 2014/0070787 A1 | 3/2014 | Arno |
| 2014/0091773 A1 | 4/2014 | Burlingame et al. |
| 2014/0092643 A1 | 4/2014 | Luccato et al. |
| 2014/0118065 A1 | 5/2014 | Briffa et al. |
| 2014/0118072 A1 | 5/2014 | Briffa et al. |
| 2014/0120854 A1 | 5/2014 | Briffa et al. |
| 2014/0167513 A1 | 6/2014 | Chang et al. |
| 2014/0167722 A1 | 6/2014 | Lee |
| 2014/0167853 A1 | 6/2014 | Haruna et al. |
| 2014/0177300 A1 | 6/2014 | Lagorce et al. |
| 2014/0184177 A1 | 7/2014 | Tournatory et al. |

(56) References Cited

U.S. PATENT DOCUMENTS

| | | |
|---|---|---|
| 2014/0266132 A1 | 9/2014 | Low et al. |
| 2014/0268945 A1 | 9/2014 | Low et al. |
| 2014/0313781 A1 | 10/2014 | Perreault et al. |
| 2014/0339918 A1 | 11/2014 | Perreault et al. |
| 2014/0355322 A1 | 12/2014 | Perreault et al. |
| 2015/0002195 A1 | 1/2015 | Englekirk |
| 2015/0023063 A1 | 1/2015 | Perreault et al. |
| 2015/0077175 A1 | 3/2015 | Giuliano et al. |
| 2015/0077176 A1 | 3/2015 | Szczeszynski et al. |
| 2015/0084701 A1 | 3/2015 | Perreault et al. |
| 2015/0255547 A1 | 9/2015 | Yuan et al. |
| 2015/0295497 A1 | 10/2015 | Perreault et al. |
| 2015/0318851 A1 | 11/2015 | Roberts et al. |
| 2016/0028302 A1 | 1/2016 | Low et al. |
| 2016/0111468 A1 | 4/2016 | Qian |
| 2022/0224229 A1* | 7/2022 | Giuliano ............ H02M 3/1582 |

FOREIGN PATENT DOCUMENTS

| | | |
|---|---|---|
| CN | 1057410 C | 10/2000 |
| CN | 1452306 A | 10/2003 |
| CN | 1483204 A | 3/2004 |
| CN | 1728518 A | 2/2006 |
| CN | 1761136 A | 4/2006 |
| CN | 1825485 A | 8/2006 |
| CN | 1988349 A | 6/2007 |
| CN | 101009433 A | 8/2007 |
| CN | 101034536 A | 9/2007 |
| CN | 101071981 A | 11/2007 |
| CN | 101079576 A | 11/2007 |
| CN | 101174789 A | 5/2008 |
| CN | 101286696 A | 10/2008 |
| CN | 101297465 A | 10/2008 |
| CN | 101399496 A | 4/2009 |
| CN | 101447753 A | 6/2009 |
| CN | 101563845 A | 10/2009 |
| CN | 101588135 A | 11/2009 |
| CN | 101611531 A | 12/2009 |
| CN | 101636702 A | 1/2010 |
| CN | 101647181 A | 2/2010 |
| CN | 101647182 A | 2/2010 |
| CN | 101662208 A | 3/2010 |
| CN | 101707437 A | 5/2010 |
| CN | 101765963 A | 6/2010 |
| CN | 101931204 A | 12/2010 |
| CN | 101976953 A | 2/2011 |
| CN | 101997406 A | 3/2011 |
| CN | 102055328 A | 5/2011 |
| CN | 102118130 A | 7/2011 |
| CN | 102171918 A | 8/2011 |
| CN | 102185484 A | 9/2011 |
| CN | 102210102 A | 10/2011 |
| CN | 102480291 A | 5/2012 |
| CN | 102769986 A | 11/2012 |
| CN | 102904436 A | 1/2013 |
| CN | 103178711 A | 6/2013 |
| CN | 103275753 A | 9/2013 |
| CN | 103636288 A | 3/2014 |
| CN | 103650313 A | 3/2014 |
| CN | 103650313 B | 3/2014 |
| CN | 103650314 A | 3/2014 |
| CN | 103975433 A | 8/2014 |
| CN | 103975433 B | 8/2014 |
| CN | 104011985 | 8/2014 |
| CN | 104011985 A | 8/2014 |
| CN | 105229908 | 1/2016 |
| CN | 105229908 A | 1/2016 |
| CN | 108964442 A | 12/2018 |
| CN | 110277908 | 9/2019 |
| CN | 115580109 | 1/2023 |
| DE | 2705597 A1 | 8/1977 |
| DE | 3347106 A1 | 7/1985 |
| DE | 10358299 A1 | 7/2005 |
| DE | 112012004377 T5 | 7/2014 |
| DE | 112012005353 | 10/2014 |
| DE | 112013006828 T5 | 3/2016 |
| EP | 0513920 A2 | 11/1992 |
| EP | 0773622 A2 | 5/1997 |
| EP | 1199788 A1 | 4/2002 |
| EP | 1635444 B1 | 3/2006 |
| EP | 1750366 A2 | 2/2007 |
| EP | 2469694 A1 | 6/2012 |
| EP | 2705597 A2 | 3/2014 |
| EP | 2705597 B1 | 8/2018 |
| EP | 3425784 A1 | 1/2019 |
| FR | 2852748 A1 | 9/2004 |
| GB | 2232830 A | 12/1990 |
| GB | 2505371 A | 2/2014 |
| GB | 2509652 A | 7/2014 |
| GB | 2512259 | 9/2014 |
| GB | 2526492 | 11/2015 |
| GB | 2526492 A | 11/2015 |
| GB | 2587732 | 4/2021 |
| GB | 2588878 | 5/2021 |
| GB | 2589040 | 5/2021 |
| JP | H05191970 A | 7/1993 |
| JP | H0787682 A | 3/1995 |
| JP | 09135567 A | 5/1997 |
| JP | 10327573 | 12/1998 |
| JP | 10327573 A | 12/1998 |
| JP | 10327575 A | 12/1998 |
| JP | H10327573 A | 12/1998 |
| JP | H10327575 A | 12/1998 |
| JP | 11235053 | 8/1999 |
| JP | 11235053 A | 8/1999 |
| JP | H11235053 A | 8/1999 |
| JP | 2000060110 A | 2/2000 |
| JP | 2000134095 A | 5/2000 |
| JP | 2002062858 A | 2/2002 |
| JP | 2002506609 A | 2/2002 |
| JP | 2002233139 A | 8/2002 |
| JP | 2002305248 A | 10/2002 |
| JP | 2003284324 A | 10/2003 |
| JP | 3475688 B2 | 12/2003 |
| JP | 2004187355 A | 7/2004 |
| JP | 2006025592 A | 1/2006 |
| JP | 2006050833 A | 2/2006 |
| JP | 2006067783 A | 3/2006 |
| JP | 2007215320 A | 8/2007 |
| JP | 2008118517 A | 5/2008 |
| JP | 2008220001 A | 9/2008 |
| JP | 2009022093 A | 1/2009 |
| JP | 2009513098 A | 3/2009 |
| JP | 2009165227 A | 7/2009 |
| JP | 2010045943 A | 2/2010 |
| JP | 2010521943 A | 6/2010 |
| JP | 2012157211 A | 8/2012 |
| JP | 2013034298 A | 2/2013 |
| JP | 2013065939 A | 4/2013 |
| JP | 5297116 B2 | 9/2013 |
| JP | 2014212654 A | 11/2014 |
| KR | 1019990002891 A | 1/1999 |
| KR | 20000052068 A | 8/2000 |
| KR | 1020100023304 A | 3/2010 |
| KR | 1020100138146 A | 12/2010 |
| KR | 1020110053681 A | 5/2011 |
| KR | 1020110061121 A | 6/2011 |
| KR | 1020120010636 A | 2/2012 |
| KR | 1020130066266 A | 6/2013 |
| KR | 1020140015528 A | 2/2014 |
| KR | 1020140033577 A | 3/2014 |
| KR | 1020140103351 | 8/2014 |
| KR | 1020150085072 A | 7/2015 |
| KR | 101556838 B1 | 10/2015 |
| KR | 1020150132530 | 11/2015 |
| KR | 1020200077607 | 6/2020 |
| KR | 20220098263 | 7/2022 |
| TW | 200701608 A | 1/2007 |
| WO | WO2004047303 A1 | 6/2004 |
| WO | WO2004047303 A8 | 6/2004 |
| WO | 2006/093600 | 9/2006 |
| WO | WO2006093600 A2 | 9/2006 |
| WO | WO2007136919 A2 | 11/2007 |
| WO | WO2009012900 A1 | 1/2009 |

(56) References Cited

FOREIGN PATENT DOCUMENTS

| WO | WO2009112900 A1 | 9/2009 |
|---|---|---|
| WO | WO2010056912 A1 | 5/2010 |
| WO | WO2011089483 A1 | 7/2011 |
| WO | WO2012085598 A2 | 6/2012 |
| WO | 2012/151466 | 11/2012 |
| WO | WO2012151466 A2 | 11/2012 |
| WO | WO2012151466 A3 | 2/2013 |
| WO | WO2013059446 A1 | 4/2013 |
| WO | WO2013086445 A1 | 6/2013 |
| WO | WO2013096416 | 6/2013 |
| WO | WO2013096416 A1 | 6/2013 |
| WO | WO2014070998 A1 | 5/2014 |
| WO | WO2014143366 | 9/2014 |
| WO | WO2014143366 A1 | 9/2014 |

OTHER PUBLICATIONS

Middlebrook—"Transformerless DC-to-DC Converters with Large Conversion Ratios" IEEE Transactions on Power Electronics, vol. 3, No. 4, pp. 484-488, Oct. 1988, Doc 7592.

Han—"A New Approach to Reducing Outpur Ripple in Switched-Capacitor-Based Step-Down DC-DC Converters" IEEE Transactions on Power Electronics, vol. 21, No. 6, pp. 1548-1555, Nov. 2006, Doc 7589.

Abutbul—"Step-Up Switching-Mode Converter with High Voltage Gain Using a Switched-Capacitor Circuit" IEEE Transactions on Circuits and Systems I, vol. 50, pp. 1098-1102, Aug. 2003, Doc 7587.

Umeno—"A New Approach to Low Ripple-Noise Switching Converters on the Basis of Switched-Capacitor Converters" IEEE Intl. Symposium on Circuits and Systems, vol. 2, pp. 1077-1080, Jun. 1991, Doc 7597.

Pilawa-Podgurski—"Merged Two-Stage Power Converter Architecture with Soft Charging Switched-Capacitor Energy Transfer" 39th IEEE Power Electronics Specialists Conference, 2008, Doc 7594.

Pilawa-Podgurski—"Merged Two-Stage Power Converter with Soft Charging Switched-Capacitor Stage in 180 nm CMOS" IEEE Journal of Solid-State Circuits, vol. 47, No. 7, pp. 1557-1567, Jul. 2012, Doc 7595.

Lei—"Analysis of Switched-Capacitor DC-DC Converters in Soft-Charging Operation" 14th IEEE Workshop on Control and Modeling for Power Electronics, p. 1-7, Jun. 23, 2013, Doc 7590.

Axelrod—"Single-switch single stage switched-capacitor buck converter", Proc. Of NORPIE 2004, 4th Nordic Workshop on Power and Industrial Electronics, Jun. 2004, Doc 7588.

Meynard—"Multi-Level Conversion: High Voltage Choppers and Voltage-Source Inverters" IEEE Power Electronics Specialists Conference pp. 397-403, 1992, Doc 7591.

Umeno et al. "A New Approach to Low Ripple-Noise Switching Converters on the Basis of Switched-Capacitor Converters" IEEE International Symposium on Circuits and Systems, vol. 2, pp. 1077-1080, Jun. 1991.

Cheng—"New Generation of Switched Capacitor Converters" PESC 98 Record, 29th Annual IEEE Power Electronics and Motion Control Conference, Wuhan, China, May 17-20, 2009, pp. 1529-1535, 7 pages.

Makowski, "Performance Limits of Switched-Capacitor DC-DC Converters", IEEE PESC'95 Conference, 1995.

Lei et al. "Analysis of Switched-capacitor DC-DC Converters in Soft-charging Operation" 14thIEEE Workshop on Control and Modeling for Power Electronics, pp. 1-7, Jun. 23, 2013.

Han et al. "A New Approach to Reducing Output Ripple in Switched-Capacitor-Based Step-Down DC-DC Converters" IEEE Transactions on Power Electronics, vol. 21, No. 6, pp. 1548-1555 Nov. 2006.

Texas Instruments data sheet for part TPS54310, "3-V to 6-V input, 3-A output synchronous-buck PWM switcher with integrated FETs", dated 2002-2005.

Cao—"Multiphase Multilevel Modular DC-DC Converter for High-Current High-Gain TEG Application" IEEE Transactions on Industry Applications, vol. 47, No. 3, May/Jun. 1991, pp. 1400-1408, 9 pages.

Xu et al., "Voltage Divider and its Application in Two-stage Power Architecture," IEEE Twenty-First Annual IEEE Applied Power Electronics Conference and Exposition, pp. 499-504, Mar. 2006.

Sun et al. "High Power Density, High Efficiency System Two-Stage Power Architecture for Laptop Computers", Power Electronics Specialists Conference, pp. 1-7, Jun. 2006.

Ottman et al., "Optimized Piezoelectric Energy Harvesting Circuit using Step-Down Converter in Discontinuous Conduction Mode", IEEE Power Electronics Specialists Conference, pp. 1988-1994, 2002.

Starzyk et al., "A DC-DC Charge Pump Design Based on Voltage Doublers," IEEE Transactions on Circuits and Systems—I: Fundamental Theory and Applications, vol. 48, No. 3, Mar. 2001, pp. 350-359.

Ng et al. "Switched Capacitor DC-DC Converter: Superior where the Buck Converter has Dominated" PhD Thesis, UC Berkeley, Aug. 17, 2011.

Axelrod et al. "Single-switch single-stage switched-capacitor buck converter", Proc. of NORPIE 2004, 4th Nordic Workshop on Power and Industrial Electronics, Jun. 2004.

Linear Technology data sheet for part LTC3402, "2A, 3MHz Micropower Synchronous Boost Converter", 2000.

Andreassen—"Digital Variable Frequency Control for Zero Voltage Switching and Interleaving of Synchronous Buck Converters" 12th Intl. Power Electronics and Motion Control Conference, IEEE Aug. 2006, pp. 184-188, 5 pages.

R. Pilawa-Podgurski and D. Perreault, "Merged Two-Stage Power Converter with Soft Charging Switched-Capacitor Stage in 180 nm CMOS," IEEE Journal of Solid-State Circuits, vol. 47, No. 7, pp. 1557-1567, Jul. 2012.

Ma et al, "Design and Optimization of Dynamic Power System for Self-Powered Integrated Wireless Sensing Nodes" ACM ISLPED '05 conference (published at pp. 303-306 of the proceedings).

Axelrod et al. "Single-switch single-stage switched-capacitor buck converter", Proc. of NORPIE 2004, 4th Nordic Workshop on Power and Industrial Electronics, Jun. 2004, entire document, pp. 1-5 of pdf submission.

Wai-Shan Ng, et al., "Switched Capacitor DC-DC Converter: Superior where the Buck Converter has Dominated", Electrical Engineering and Computer Sciences University of California at Berkeley, Technical Report No. UCB/EECS-2011-94, http://www.eecs.berkeley.edu/Pubs/TechRpts/2011/EECS-2011-94.html, Aug. 17, 2011, 141 pgs.

Pilawa-Podgurski et al. "Merged Two-Stage Power Converter Architecture with Soft Charging Switched-Capacitor Energy Transfer" 39th IEEE Power Electronics Specialists Conference, 2008.

T. A. Meynard, H. Foch, "Multi-Level Conversion: High Voltage Choppers and Voltage-Source Inverters," IEEE Power Electronics Specialists Conference, pp. 397-403, 1992.

Pal Andreassen et al., Digital Variable Frequency Control for Zero Voltage Switching and Interleaving of Synchronous Buck Converters, 12th International Power Electronics and Motion Control Conference, Aug. 1, 2006, IEEE, Pi Publication date: Aug. 1, 2006.

Dong Cao, Fang Zheng Peng, Multiphase Multilevel Modular DC DC Converter for High-Current High-Gain TEG Application, vol. 47, Nr.: 3, IEEE Transactions on Industry Applications., May 1, 2011, IEEE Service Center, Piscataway, NJ., US, Publication date: May 1, 2011.

Luo et al., "Investigation of switched-capacitorized DC/DC converters," 2009 IEEE 6th International Power Electronics and Motion Control Conference, Wuhan, China, May 17-20, 2009, pp. 1270-1276, doi: 10.1109/IPEMC.2009.5157581.

U.S. Appl. No. 16/919,033: Amended Application Data Sheet filed Jul. 2, 2020, 7 pages.

Cheng, "New generation of switched capacitor converters," PESC 98 Record. 29th Annual IEEE Power Electronics Specialists Conference (Cat. No. 98CH36196), Fukuoka, Japan, May 22, 1998, pp. 1529-1535 vol. 2, doi: 10.1109/PESC.1998.703377.

(56) References Cited

OTHER PUBLICATIONS

Cervera et al. "A High Efficiency Resonant Switched Capacitor Converter with Continuous Conversion Ratio," Energy Conversion Congress and Exposition (ECCE), Sep. 2013, pp. 4969-4976.
Y. Lei, R. May and R. Pilawa-Podgurski, "Split-Phase Control: Achieving Complete Soft-Charging Operation of a Dickson Switched-Capacitor Converter," in IEEE Transactions on Power Electronics, vol. 31, No. 1, pp. 770-782, Jan. 2016, doi: 10.1109/TPEL.2015.2403715.
Alon Cervera et al. 'A high efficiency resonant switched capacitor converter with continuous conversion ratio' Energy Conversion Congress and Exposition, IEEE, 2013, pp. 4969-4976.
U.S. Appl. No. 15/277,056, Request for Corrected Filing Receipt and Acknowledgment of Loss of Entitlement to Entity Status Discount dated Oct. 3, 2017, 17 pages, Doc 9051.
U.S. Appl. No. 15/277,056, Corrected Filing Receipt dated Oct. 5, 2017, 3 pages, Doc 9052.
U.S. Appl. No. 15/277,056, Non-Final Office Action dated Jan. 12, 2018, 60 pages, Doc 9053.
U.S. Appl. No. 15/277,056, Request for Updated Filing Receipt dated Feb. 23, 2018, 11 pages, Doc 9054.
U.S. Appl. No. 15/277,056, Corrected Filing Receipt dated Mar. 29, 2018, 3 pages, Doc 9055.
U.S. Appl. No. 15/277,056, Response to Non-Final Office Action dated Apr. 12, 2018, 13 pages, Doc 9056.
U.S. Appl. No. 15/277,056, Notice of Allowance dated Jun. 15, 2018, 65 pages, Doc 9057.
U.S. Appl. No. 15/277,056, Issue Fee Payment dated Aug. 21, 2018, 6 pages, Doc 9058.
U.S. Appl. No. 15/277,056, Issue Notification dated Sep. 5, 2018, 1 page, Doc 9059.
U.S. Appl. No. 16/139,583, filed Sep. 24, 2018, 1 page, Doc 9060.
U.S. Appl. No. 16/139,583 Non-Final Office Action dated Nov. 16, 2018, 121 page, Doc 9061.
U.S. Appl. No. 16/139,583 Response to Non-Final Office Action dated Jan. 11, 2019, 11 pages, Doc 9062.
U.S. Appl. No. 16/139,583 Notice of Publication dated Jan. 24, 2019, 1 page, Doc 9063.
U.S. Appl. No. 16/139,583 Notice of Allowance dated Mar. 5, 2019, 128 pages, Doc 9064.
U.S. Appl. No. 16/139,583 Rule 312 Amendment and Issue Fee Payment dated Jul. 26, 2015, 15 pages, Doc 9065.
U.S. Appl. No. 16/139,583 Corrected Ntc of Allowability dated Aug. 22, 2019, 7 pages, Doc 9066.
U.S. Appl. No. 16/139,583 Issue Notification dated Sep. 4, 2019, 1 page, Doc 9067.
PCT/US12/60798 International Search Report dated Mar. 27, 2013, 3 pages, Doc 9068.
PCT/US12/60798 Written Opinion of the International Searching Authority dated Mar. 27, 2013, 4 pages, Doc 9069.
PCT/US12/60798 International Preliminary Report on Patentability dated Apr. 22, 2014, 5 pages, Doc 9070.
CN201280051526 The First Office Action dated Jun. 17, 2016, 9 pages, Doc 9071.
CN201280051526 Amended Claims and Response to The First Office Action dated Jul. 15, 2016, 33 pages, Doc 9072.
CN201280051526 Notification of Grant dated May 25, 2017, 2 pages, Doc 9073.
U.S. Appl. No. 61/548,360, filed Oct. 18, 2011, 25 pages, Doc 9074.
U.S. Appl. No. 61/548,360, filed Oct. 27, 2011, 3 pages, Doc 9075.
Examiner Initialed 1449s/SB08s for U.S. Appl. No. 13/654,113 considered May 6, 2013, 1 pg, Doc 9076.
Examiner Initialed 1449s/SB08s for U.S. Appl. No. 13/654,113 considered Sep. 18, 2013, 1 pg, Doc 9077.
Examiner Initialed 1449s/SB08s for U.S. Appl. No. 14/294,642 considered Nov. 14, 2014, 2 pgs, Doc 9078.
Examiner Initialed 1449s/SB08s for U.S. Appl. No. 15/227,056 considered Sep. 27, 2016, 2 pgs, Doc 9079.
Examiner Initialed 1449s/SB08s for U.S. Appl. No. 16/139,583 considered Nov. 11, 2018, 2 pgs, Doc 9080.

U.S. Appl. No. 13/654,113, filed Nov. 9, 2012, 4 pages Doc 9001.
U.S. Appl. No. 13/654,113, filed Nov. 16, 2012, 3 pages Doc 9002.
U.S. Appl. No. 13/654,113, Decision Granting Request for Prioritized Examination dated Nov. 28, 2012, 1 page Doc 9003.
U.S. Appl. No. 13/654,113, Restriction Requirement dated Mar. 29, 2013, 7 pages Doc 9004.
U.S. Appl. No. 13/654,113, Response to Restriction Requirement dated Apr. 3, 2013, 3 pages Doc 9005.
U.S. Appl. No. 13/654,113, Notice of Publication dated Apr. 18, 2013, 1 page Doc 9006.
U.S. Appl. No. 13/654,113, Request for Corrected Filing Receipt dated Apr. 25, 2013, 9 pages Doc 9007.
U.S. Appl. No. 13/654,113, Replacement Filing Receipt and Ntc of Acceptance of POA dated May 8, 2013, 4 pages Doc 9008.
U.S. Appl. No. 13/654,113, Non-Final Office Action dated Jun. 24, 2013, 24 pages Doc 9009.
U.S. Appl. No. 13/654,113, Response to Non-Final Office Action dated Sep. 18, 2013, 70 pages Doc 9010.
U.S. Appl. No. 13/654,113, Final Office Action dated Oct. 28, 2013, 32 pages Doc 9011.
U.S. Appl. No. 13/654,113, Response to Final Office Action dated Jan. 31, 2014, 13 pages Doc 9012.
U.S. Appl. No. 13/654,113, Notice of Appeal dated Feb. 28, 2014, 11 pages Doc 9013.
U.S. Appl. No. 13/654,113, Notice of Allowance dated Mar. 7, 2014, 32 pages Doc 9014.
U.S. Appl. No. 13/654,113, Issue Fee Payment dated Apr. 24, 2014, 6 pages Doc 9015.
U.S. Appl. No. 13/654,113, Issue Notification dated May 14, 2014, 1 page Doc 9016.
U.S. Appl. No. 13/654,113, Notification of Loss of Entitlement to Small Entity Status under 37 CFR 1.27(g)(2) dated Jun. 5, 2017, 1 page Doc 9017.
U.S. Appl. No. 13/654,113, Acknowledgment of Loss of Entitlement to Small Entity Status Discount dated Jun. 9, 2017, 1 page Doc 9018.
U.S. Appl. No. 14/294,642, Notice to File Missing Parts and Filing Receipt dated Jun. 13, 2014, 6 pages Doc 9019.
U.S. Appl. No. 14/294,642, Response to Notice to File Missing Parts dated Aug. 13, 2014, 6 pages Doc 9020.
U.S. Appl. No. 14/294,642, Updated Filing Receipt dated Aug. 19, 2014, 4 pages Doc 9021.
U.S. Appl. No. 14/294,642, Decision on Request to Participate in the Patent Prosecution Highway Program and Petition to Make Special under 37 CFR 1.102(a), dated Aug. 25, 2014, 2 pages Doc 9022.
U.S. Appl. No. 14/294,642, Restriction Requirement dated Sep. 25, 2014, 7 pages Doc 9023.
U.S. Appl. No. 14/294,642, Notice of Publication dated Oct. 8, 2014, 1 page Doc 9024.
U.S. Appl. No. 14/294,642, Response to Restriction Requirement dated Oct. 24, 2014, 3 pages Doc 9025.
U.S. Appl. No. 14/294,642, Non-Final Office Action dated Nov. 20, 2014, 10 pages Doc 9026.
U.S. Appl. No. 14/294,642, Response to Non-Final Office Action dated Feb. 20, 2015, 15 pages Doc 9027.
U.S. Appl. No. 14/294,642, Final Office Action dated Mar. 19, 2015, 11 pages Doc 9028.
U.S. Appl. No. 14/294,642, Response to Final Office Action dated May 19, 2015, 34 pages Doc 9029.
U.S. Appl. No. 14/294,642, Advisory Action dated Jun. 9, 2015, 4 pages Doc 9030.
U.S. Appl. No. 14/294,642, Notice of Appeal dated Jun. 17, 2015, 11 pages Doc 9031.
U.S. Appl. No. 14/294,642, Notice of Panel Decision dated Jun. 4, 2015, 2 pages Doc 9032.
U.S. Appl. No. 14/294,642, Non-Final Office Action dated Aug. 25, 2015, 18 pages Doc 9033.
U.S. Appl. No. 14/294,642, Response to Office Action dated Nov. 25, 2015, 44 pages Doc 9034.
U.S. Appl. No. 14/294,642, Final Office Action dated Jan. 11, 2016, 46 pages Doc 9035.

(56) References Cited

OTHER PUBLICATIONS

U.S. Appl. No. 14/294,642, Notice of Appeal dated Apr. 11, 2016, 9 pages Doc 9036.
U.S. Appl. No. 14/294,642, Petition for Review dated Apr. 18, 2016, 8 pages Doc 9037.
U.S. Appl. No. 14/294,642, Notice of Panel decision dated May 31, 2016, 2 pages Doc 9038.
U.S. Appl. No. 14/294,642, Final Office Action dated Mar. 19, 2015, 11 pages Doc 9039.
U.S. Appl. No. 14/294,642, Notice of Allowance dated Jun. 27, 2016, 88 pages Doc 9040.
U.S. Appl. No. 14/294,642, Request for Corrected Filing Receipt dated Sep. 20, 2016, 34 pages Doc 9041.
U.S. Appl. No. 14/294,642, Corrected Filing Receipt dated Sep. 23, 2016, 3 pages Doc 9042.
U.S. Appl. No. 14/294,642, Issue Fee Payment dated Sep. 27, 2016, 17 pages Doc 9043.
U.S. Appl. No. 14/294,642, Rule 312 Amendment and Issue Fee payment dated Oct. 5, 2016, 7 pages Doc 9044.
U.S. Appl. No. 14/294,642, Issue Notification dated Oct. 26, 2016, 1 page Doc 9045.
U.S. Appl. No. 14/294,642, Acknowledgment of Loss of Entitlement to Entity Status Discount dated Jun. 9, 2017, 1 page Doc 9046.
U.S. Appl. No. 15/277,056, Filing Receipt and Notice to File Missing Parts dated Oct. 11, 2016, 6 pages, Doc 9047.
U.S. Appl. No. 15/277,056, Preliminary Amendment and response to Notice to File Missing Parts dated Mar. 13, 2017, 14 pages, Doc 9048.
U.S. Appl. No. 15/277,056, Updated Filing Receipt dated Mar. 15, 2017, 4 pages, Doc 9049.
U.S. Appl. No. 15/277,056, Notice of Publication dated Jun. 21, 2017, 1 page, Doc 9050.
U.S. Appl. No. 61/380,522, filed Sep. 7, 2010, Chris Levesque et al.
U.S. Appl. No. 61/417,633, filed Nov. 29, 2010, Chris Levesque et al.
Markowski, "Performance Limits of Switched-Capacitor DC-DC Converters", IEEE PESC'95 Conference, 1995.
Andreassen—"Digital Variable Frequency Control for Zero Voltage Switching and Interleaving of Synchronous Buck Converters" 12th Intl. Power Electronics and Motion Control Conference, IEEE Aug. 2006, pp. 184-188, 5 pages, Doc 7043.
Pilawa-Podgurski et al. "Merged Two-Stage Power Converter Architecture with Soft Charging Switched-Capacitor Energy Transfer" 39th IEEE Power Electronics Specialists Conference, 2008, pp. 4008-4015.
Xiaoguo Liang et al., Evaluation of Narrow Vdc-Based Power Delivery Architecture in Mobile Computing System, IEEE Transactions on Industry Applications., Nov. 1, 2011, IEEE Service Center, Piscataway, NJ., US.
Xiaoguo Liang et al., "Evaluation of Narrow Vdc-Based Power Delivery Architecture in Mobile Computing System," IEEE Transactions on Industry Applications, vol. 47, No. 6: pp. 2539-2548 (Dec. 1, 2011).
O. Abutbul et al. "Step-Up Switching-Mode Converter With High Voltage Gain Using a Switched-Capacitor Circuit" IEEE Transactions on Circuits and Systems I., vol. 50, pp. 1098-1102, Aug. 2003.
Sun—"High Power Density, High Efficiency System Two-Stage Power Architecture for Laptop Computers" Power Electronic Specialists Conference, pp. 1-7, Jun. 18, 2006, Doc 7596.
Luo—"Investigation of Switched-Capacitorized DC/DC Converters" 2009 IEEE 6th Intl. Power Electronics and Motion Control Conference, Wuhan, China, May 17-20, 2009, pp. 1270-1276, 7 pages, Doc 7050.
Cheng—"New Generation of Switched Capacitor Converters" PESC 98 Record, 29th Annual IEEE Power Electronics and Motion Control Conference, Wuhan, China, May 17-20, 2009, pp. 1529-1535, 7 pages, Doc 7049.
Cao—"Multiphase Multilevel Modular DC-DC Converter for High-Current High-Gain TEG Application" IEEE Transactions on Industry Applications, vol. 47, No. 3, May/Jun. 1991, pp. 1400-1408, 9 pages, Doc 7042.
Wood et al, "Design, Fabrication and Initial Results of a 2g Autonomous Glider" IEEE Industrial Electronics Society, pp. 1870-1877, Nov. 2005.
R. D. Middlebrook, "Transformerless DC-to-DC Converters with Large Conversion Ratios" IEEE Transactions on Power Electronics, vol. 3, No. 4, pp. 484-488, Oct. 1988.
Yeung, "Multiple Fractional Voltage Conversion Ratios for Switched Capacitor Resonant Converters", Jun. 1, 2001.
David Giuliano, "Miniaturized, low-voltage power converters with fast dynamic response" Thesis (Ph. D.)—Massachusetts Institute of Technology, Department of Electrical Engineering and Computer Science, Sep. 2013.

\* cited by examiner

MULTILAYER POWER, CONVERTER WITH DEVICES HAVING REDUCED LATERAL CURRENT

RELATED APPLICATIONS

This application is a continuation of U.S. application Ser. No. 17/452,275, filed Oct. 26, 2021, now U.S. Pat. No. 11,908,844 issued on Feb. 20, 2024, which is a continuation of U.S. application Ser. No. 16/558,679, filed Sep. 3, 2019, now U.S. Pat. No. 11,183,490, issued on Nov. 23, 2021, which is a continuation of U.S. application Ser. No. 16/139,583, filed Sep. 24, 2018, now U.S. Pat. No. 10,424,564, issued on Sep. 24, 2019, which is a continuation of U.S. application Ser. No. 15/277,056, filed on Sep. 27, 2016, now U.S. Pat. No. 10,083,947, issued on Sep. 25, 2018, which is a continuation of U.S. application Ser. No. 14/294,642, filed on Jun. 3, 2014, now U.S. Pat. No. 9,497,854, issued on Nov. 15, 2016, which is a divisional of U.S. application Ser. No. 13/654,113, filed on Oct. 17, 2012, now U.S. Pat. No. 8,743,553, issued on Jun. 3, 2014, which claims the benefit of the priority date of U.S. Provisional Application No. 61/548,360, filed on Oct. 18, 2011, the contents of which are herein incorporated by reference in their entireties.

FIELD OF DISCLOSURE

The present invention relates to energy storage elements in power converters that use capacitors to transfer energy.

BACKGROUND

Power converters generally include switches and one or more capacitors, for example, to power portable electronic devices and consumer electronics. A switch-mode power converter is a specific type of power converter that regulates its output voltage or current by switching storage elements (i.e. inductors and capacitors) into different electrical configurations using a switch network.

One type of switch-mode power converter is the switched capacitor converter. A switched capacitor converter uses capacitors to transfer energy. As the transformation ratio increases, the number of capacitors and switches increases.

A switch capacitor converter includes a switch network containing numerous switches. These switches are active devices that are usually implemented with transistors. The switch network can be integrated on a single or on multiple monolithic semiconductor substrates. Typical power converters perform voltage transformation and output regulation. In many power converters, such as a buck converter, this is carried out in a single stage. However, it is also possible to split these two functions into two specialized stages. Such two-stage power converter architectures feature a transformation stage and a separate regulation stage. The transformation stage transforms one voltage into another, while the regulation stage ensures that the voltage and/or current output of the transformation stage maintains desired characteristics.

An example of a two-stage power converter architecture is illustrated in FIG. 1A, where capacitors are utilized to transfer energy. The transformation stage is represented by a switched-capacitor element 12A, which closely resembles a switched capacitor converter while the regulation stage is represented by a regulating circuit 16A.

In this architecture, a switched capacitor element 12A is electrically connected to a voltage source 14 at an input end thereof. An input of a regulating circuit 16A is electrically connected to an output of the switched capacitor element 12A. A load 18A is then electrically connected to an output of the regulating circuit 16A. Such a converter is described in US Patent Publication 2009/0278520, filed on May 8, 2009, the contents of which are herein incorporated by reference. Furthermore, a modular multi-stage power converter architecture was described in PCT Application PCT/2012/36455, filed on May 4, 2012, the contents of which are also incorporated herein by reference.

The switched capacitor element 12A and regulating circuit 16A can be mixed and matched in a variety of different ways. This provides a transformative integrated power solution (TIPS™) for the assembly of such converters. As such, the configuration shown in FIG. 1A represents only one of multiple ways to configure one or more switched capacitor elements 12 with one or more regulating circuits 16A.

Typically, the switch network of the switched capacitor element 12A and the regulating circuit 16A are fabricated in a semiconductor process that has passive devices. However, these passive devices are normally used in the analog circuitry to control the power converter. They are not normally used to store energy in the power converter. This is because these passive devices cannot efficiently store a significant amount of energy.

These passive devices are usually planar and fabricated after the active devices in a higher level of metal to reduce parasitic effects. Since these passive devices are fabricated after the active devices, and on the same wafer as the active devices, the processing steps for making these passive devices should be chosen carefully. An incorrect choice may damage the active devices that have already been fabricated.

To avoid possibly damaging the active devices during fabrication of the passive devices,
  it is preferable to only use CMOS compatible processing. Given this processing requirement, it is difficult and/or expensive to achieve high capacitance density capacitors or high Q inductors in a CMOS flow. Therefore, in power converters, it is common practice to store energy in discrete components, such as multilayer ceramic capacitors and chip inductors. However, it is possible to produce inexpensive high performance passive devices in their own wafer and process flow that can be used in specific applications. These devices will be referred to as integrated passive devices (IPDs).

An implementation of the power converter architecture shown in FIG. 1A is illustrated in FIG. 1B-1D.

In the embodiment shown in FIG. 1B, a power converter 20 draws energy from a voltage source 14 at a high input voltage VIN and delivers that energy to a load 18A at a low output voltage VO. Without loss of generality, the load 18A is modeled as a resistor.

The power converter 20 includes a switched capacitor element 12A that features a 3:1 series-parallel switched capacitor network having power switches S1-S7 and pump capacitors C21-C22. In contrast, the regulating circuit 16A is a buck converter having first and second output power switches SL, SH, a filter inductor L1, and an output capacitor CO. The power switches S1-S7, the output power switches SL, SH, and the driver/control circuitry 23 are integrated in a single semiconductor die 22. However, the pump capacitors C21-C22, the filter inductor L1, and a decoupling input capacitor CIN1 are discrete components.

In operation, the power switches S1, S3, S6 and the power switches S2, S4, S5, S7 are always in complementary states. Thus, in a first switch state, the power switches S1, S3, S6 are open and the power switches S2, S4, S5, S7 are closed. In a second switch state, the power switches S1, S3, S6 are closed and the power switches S2, S4, S5, S7 are open. Similarly, the output power switches SL, SH are in complementary states.

Typically, the regulating circuit 16A operates at higher switching frequencies than the switched capacitor element 12A. However, there is no requirement of any particular relationship between the switching frequencies of the regulating circuit 16A and the switching frequency of the switched capacitor element 12A. The driver/control circuitry 23 provides the necessary power to activate the switches and controls the proper switch states to ensure a regulated output voltage VO.

In power converters, it is common practice to solder a semiconductor die 22 or packaged die to an electrical interface 28, and to then horizontally mount capacitors and inductors on the electrical interface 28 around the semiconductor die 22. Such an arrangement is shown in a top view in FIGS. 1D and 1n a side view in FIG. 1C taken along a line 24 in FIG. 1D.

An electrical interface 28 provides electrical conductivity between the power converter 20 and a load to which the power converter 20 is ultimately supplying power. Examples of electrical interfaces 28 include printed circuit boards, package lead frames, and high density laminates.

The discrete components in the power converter 20 include the pump capacitors C21-C22, the input capacitor CIN1, the output capacitor CO, and the filter inductor L1. These
  discrete components are horizontally disposed with respect to the semiconductor die 22 and electrically coupled to the die 22 by traces on the electrical interface 28.
Each power switch in the power converter 20 is typically composed of numerous smaller switches connected in parallel as illustrated by the close-up 26 in FIG. 1D. This allows the power switches to carry a large amount of current without overheating.

SUMMARY

In one aspect, the invention features an apparatus including a power converter circuit, the power converter circuit including a first active layer having a first set of switching devices disposed on a face thereof, a first passive layer having first set of passive devices disposed on a face thereof, and interconnection to enable the switching devices disposed on the face of the first active layer to be interconnected with the non-active devices disposed on the face of the first passive layer, wherein the face on which the first set of switching devices on the first active layer is disposed faces the face on which the first set of passive devices on the first passive layer is disposed.

In some embodiments, the face on which the first set of switching devices on the first active layer is disposed faces the face on which the first set of passive devices on the first passive layer is disposed.

In some embodiments, the interconnection to enable the switching devices disposed on
  the face of the first active layer to be interconnected with the passive devices disposed on the
  face of the first passive layer includes a thru via extending through at least one of the first active layer and the first passive layer. Among these embodiments are those in which the
  interconnection to enable the switching devices disposed on the face of the first active layer to be interconnected with the passive devices disposed on the face of the first
    passive layer further includes an interconnect structure connected to the thru via and to one of the first active layer
    and the first passive layer.

In other embodiments, the power converter circuit further includes one or more additional layers. Among these embodiments are those in which the one or more additional layers comprise
  a second passive layer containing a second set of passive devices, those in which the one or more additional layers includes a second active layer containing a second set of switching devices, and
those in which the one or more additional layers comprise a second layer having a face on which a third set of devices is disposed and a third layer having a face on which a fourth set of devices is disposed, and wherein the face on which the fourth set of devices is disposed faces the face on which the third set of devices is disposed.

Also among the embodiments are those in which the first passive layer includes an energy-storage element. Among these are those in which the energy-storage element includes a capacitor. In some of these embodiments, the capacitor includes a planar capacitor, whereas in others, the capacitor includes a trench capacitor.

Some embodiments include an electrical interface, and a connection between the electrical interface and the first active layer of the circuit. Others include an electrical interface, and a connection between the electrical interface and the first non-active layer of the circuit.

In some embodiments, the power converter circuit further includes vias extending through the first active layer. Among these are embodiments in which the power converter circuit further includes vias extending through the first passive layer.

Also included among the embodiments of the invention are those in which the power converter circuit further includes additional layers, wherein the additional layers comprise a second active layer and a third active layer, the apparatus further including a thru via connected the second active layer and the third active layer.

In addition to all the foregoing embodiments, additional embodiments of the invention are those in which the power converter circuit further includes additional layers, wherein the additional layers comprise a second passive layer and a third passive layer, the power converter circuit further including a thru via providing an electrical connection between the second passive layer and the third passive layer.

The power converter circuit can implement any power converter circuit. In one embodiment, the power converter circuit implements a buck converter. In another embodiment, the power converter circuit implements a switched capacitor circuit.

In some embodiments, the first passive layer includes capacitors. Among these embodiments are those that further include an electrical interface and solder bumps connecting the power converter circuit to the electrical interface, wherein the solder bumps are disposed according to a solder bump pitch, and wherein the interconnection has an interconnection pitch, the interconnection pitch being smaller than the solder bump pitch, as well as those in which at least one of the capacitors is sized to fit at least one of above a switching device in the first active layer and below a switching device in the first active layer.

In some embodiments, the electrical interconnect includes a multilayer interconnect structure.

Other embodiments include a driver and control unit to provide power and to control the switching devices.

In some embodiments, the apparatus also includes a data processing unit and a touch-screen interface, both of which are configured to consume power provided by said switched mode power converter circuit. Among these are embodiments that also include a wireless transmitter and receiver, all of which are configured to consume power provided by said switched mode power converter circuit. Examples of such embodiments are smart phones, tablet computers, laptop computers, and other portable electronic devices.

In another aspect, the invention features an apparatus including passive layers, active layers, thru vias, and at least one interconnection layer. The interconnection layer provides electrical connection between an active layer and a passive layer. The thru vias provide electrical connection between two or more active layers, or between two or more passive layers.

In another aspect, the invention features an apparatus having a power converter circuit including a stack of layers, the stack including an active layer having active devices integrated on a device face thereof and a passive layer having passive devices integrated on a device face, thereof. Either an active device or a passive device is partitioned into at least two partitions. Each partition defines a current channel along a first axis, The partitioned component thus suppresses current flow along a second axis orthogonal to the first axis.

In some embodiments, the passive devices include a planar capacitor.

Other embodiments include a regulating circuit having a first regulating circuit partition and a second regulating circuit partition. The regulating circuit is connected to receive an output from the power converter circuit. The embodiment also includes a first inductor having a first terminal and a second terminal, the first terminal being connected to an output of the first regulating circuit partition, and the second terminal being connected to a load, a second inductor having a first terminal and a second terminal, the first terminal being connected to an output of the second regulating circuit partition, and the second terminal being connected to the second terminal of the first inductor, whereby in operation, the second terminal of the first inductor and the second terminal of the second inductor are at a common potential. Among these embodiments are those that include a load connected to the second terminal of the first inductor and the second terminal of the second inductor.

In some embodiments, the first switched capacitor unit is positioned over the first regulating circuit partition at a location that minimizes an extent to which current travels between the power converter circuit and the first regulating circuit partition.

These and other features of the invention will be apparent from the following description and the accompanying figures in which:

DETAILED DESCRIPTION

Power converters that use capacitors to transfer energy have certain disadvantages when packaged in the traditional way. Such power converters require a larger number of components and a larger number of pins than conventional topologies. For example, power converter 20 requires two additional capacitors and four additional pins when compared to a buck converter.

Furthermore, extra energy is lost due to parasitic losses in the interconnection structure between the additional capacitors and the devices in the switch network. The devices and methods described herein address these issues by vertically integrating the passive devices with the active devices within a power converter.

Embodiments described herein generally include three components: a passive device layer 41A, also referred to a "passive layer", an active device layer 42A, also referred to as an "active layer", and an interconnect structure 43B. Each layer has devices that will typically be integrated on a single monolithic substrate or on multiple monolithic substrates, both of which may also be incorporated within a reconstituted wafer as in the case of fan-out wafer scale packaging. The passive layer 41A can be fabricated by an IPD process while the active layer 42A can be fabricated by a CMOS process. Each device layer pair is electrically connected together through a high density interconnect structure, which may also include a redistribution layer or micro bumps.

Additionally, thru vias 47A can be included which allow electrical connections to additional device layers. In the case of a single monolithic substrate, the thru vias may include thru silicon vias, whereas in the case of a reconstituted wafer, the thru vias may include thru mold vias.

Figure 2A:
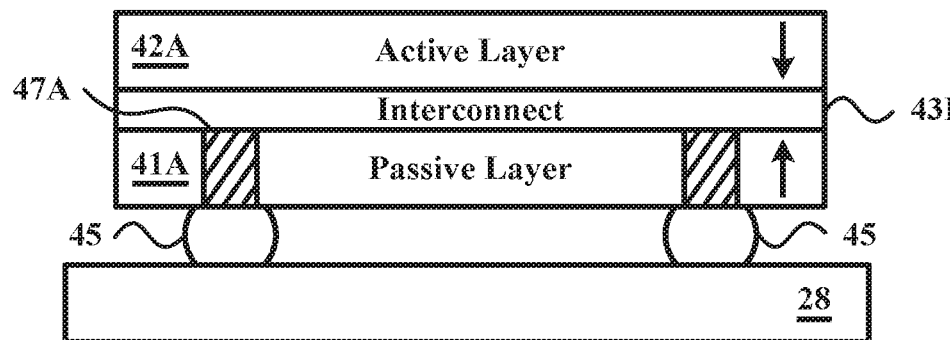
FIGS. 2A-2C are side views of various power converters with integrated capacitors.
Figure 2B:
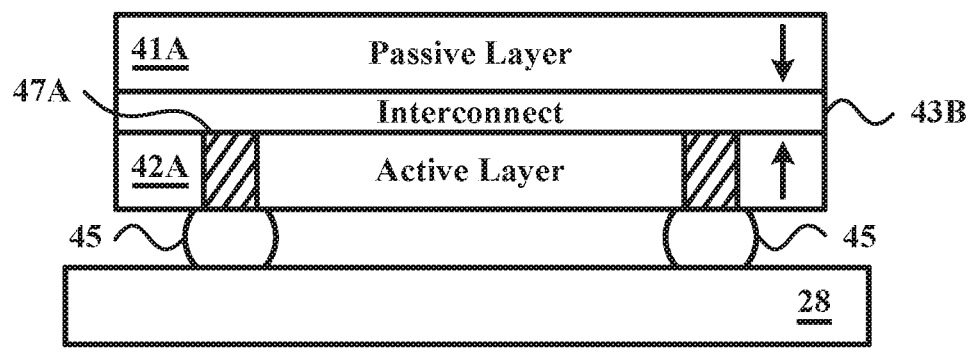
Figure 2C:
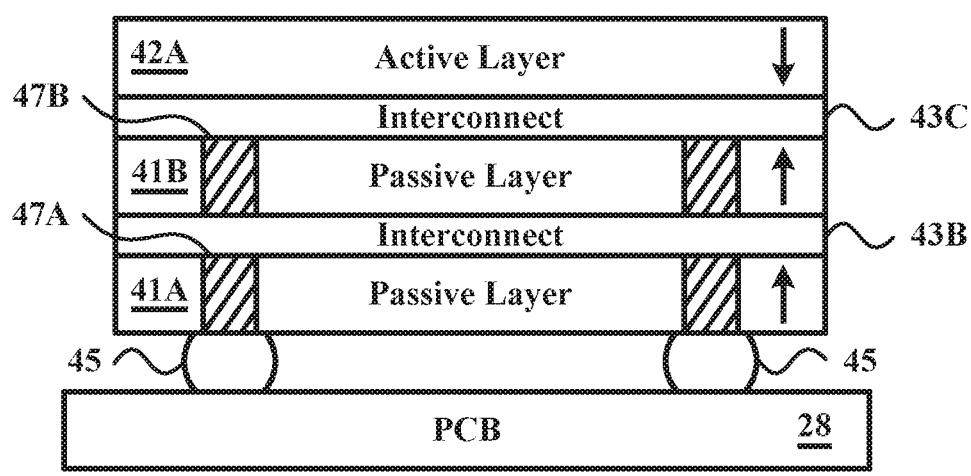

Side views of three different embodiments with thru vias 47A are illustrated in FIGS. 2A-2C. These are only a few of the possible permutations. Each side-view includes at least a passive layer 41A, an active layer 42A, thru vias 47A, and an interconnect structure 43B.

The passive layer 41A includes passive devices such as capacitors, inductors, and resistors. The active layer 42A includes active devices such as transistors and diodes. The interconnect structure 43B provides electrical connections between the passive layer 41A and the active layer 42A. Meanwhile, thru vias 47A allow for electrical connections to pass thru the passive layer 41A or thru the active layer 42A.

The interconnect structure 43B can also provide electrical connection between devices on the same layer. For example, separate active devices in different locations on the active layer 42A can be electrically connected using the interconnect structure 43B.

In the particular embodiment shown in FIG. 2A, the passive layer 41A is between the active layer 42A and the electrical interface 28. An interconnect structure 43B provides interconnections between devices on the active layer 42A and devices on the passive layer 41A. The interconnect structure 43B in some cases can also provide electrical connections between two devices that are on the same passive layer 41A or two devices on the same active layer 42A. Each device layer 41A, 42A has a device face on which the devices are actually formed. The locations of these device faces are indicated by the pair of arrows.

In the embodiment of FIG. 2A, the device face on the active layer 42A faces, or is opposed to, the device face on the passive layer 41A. Thru vias 41A cut through the passive layer and connect to the interconnect structure 43B. Thus, the path between devices on layers separated by intervening layers generally includes at least a portion through an interconnect structure 34B and a portion through a via 41A. In this way, the interconnect structure 34B provides electrical continuity between devices in different layers, whether the layers are adjacent or otherwise.

In the alternative embodiment shown in FIG. 2B, the active layer 42A is between the passive layer 41A and the electrical interface 28. Thru vias 42A in this case pass through the active layer 42A. Once again, an interconnect structure 43B connects the passive devices on the passive layer 41A, the active devices on the active layer 42A, and the thru vias 47A. Once again, as indicated by the arrows, the device face of the passive layer 41A and the device face of the active layer 42A are opposite each other.

As shown in yet another embodiment in FIG. 2C, it is also possible to use more than two device layers by stacking one or more passive layers and one or more active layers. In the particular embodiment shown in FIG. 2C, such a stack includes first and second passive layers 41A-41B capped by an active layer 42A. The embodiment further includes a first interconnect structure 43B between the first and second passive layers 41A, 41B and a second interconnect structure 43C between the second passive layer 41B and the active layer 42A. As indicated by the arrows, the device faces of the second passive layer 41B and the active layer 42A face each other, but the device faces of the first and second passive layers 41A, 41B do not.

Figure 1A:
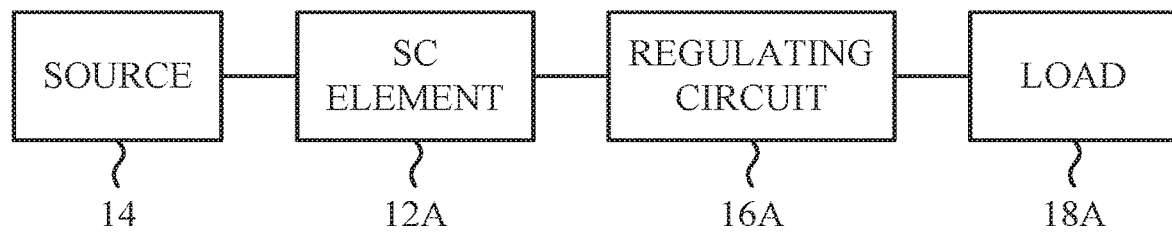
FIG. 1A is a block diagram of a known power converter architecture.
Figure 1B:
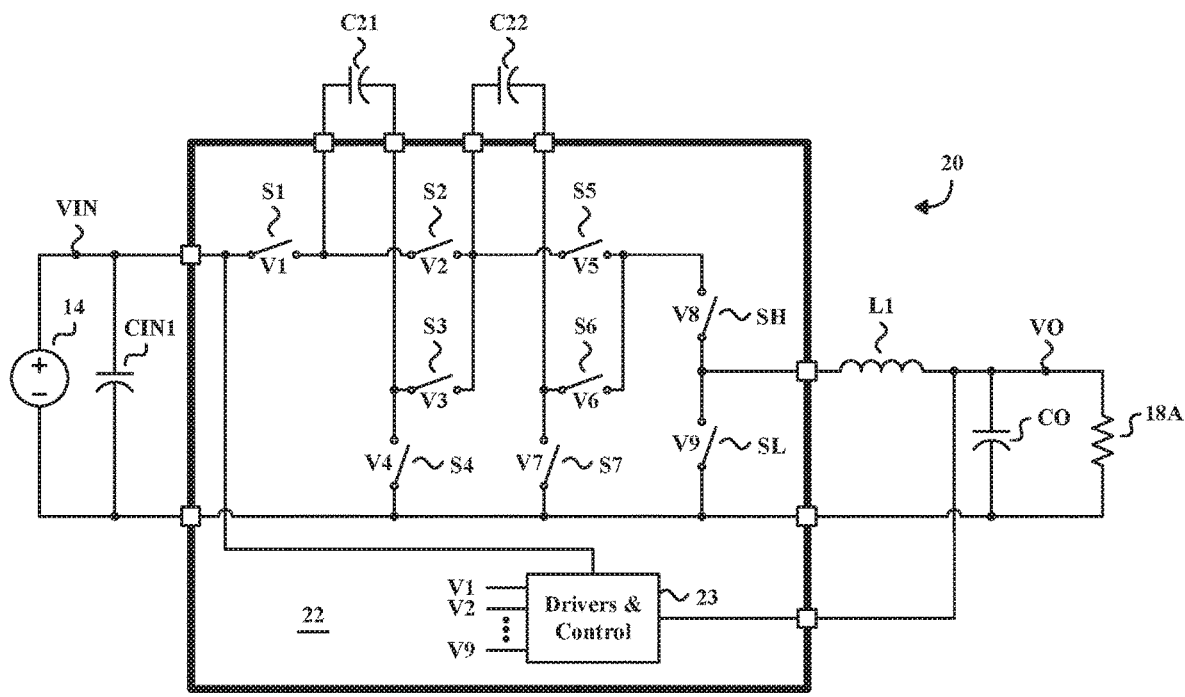
FIG. 1B is a particular implementation of the converter architecture shown in FIG. 1.

The embodiment shown in FIG. 2A-2C can be used to eliminate the pin count penalty in power converter 20 shown in FIG. 1B.

Figure 3A:
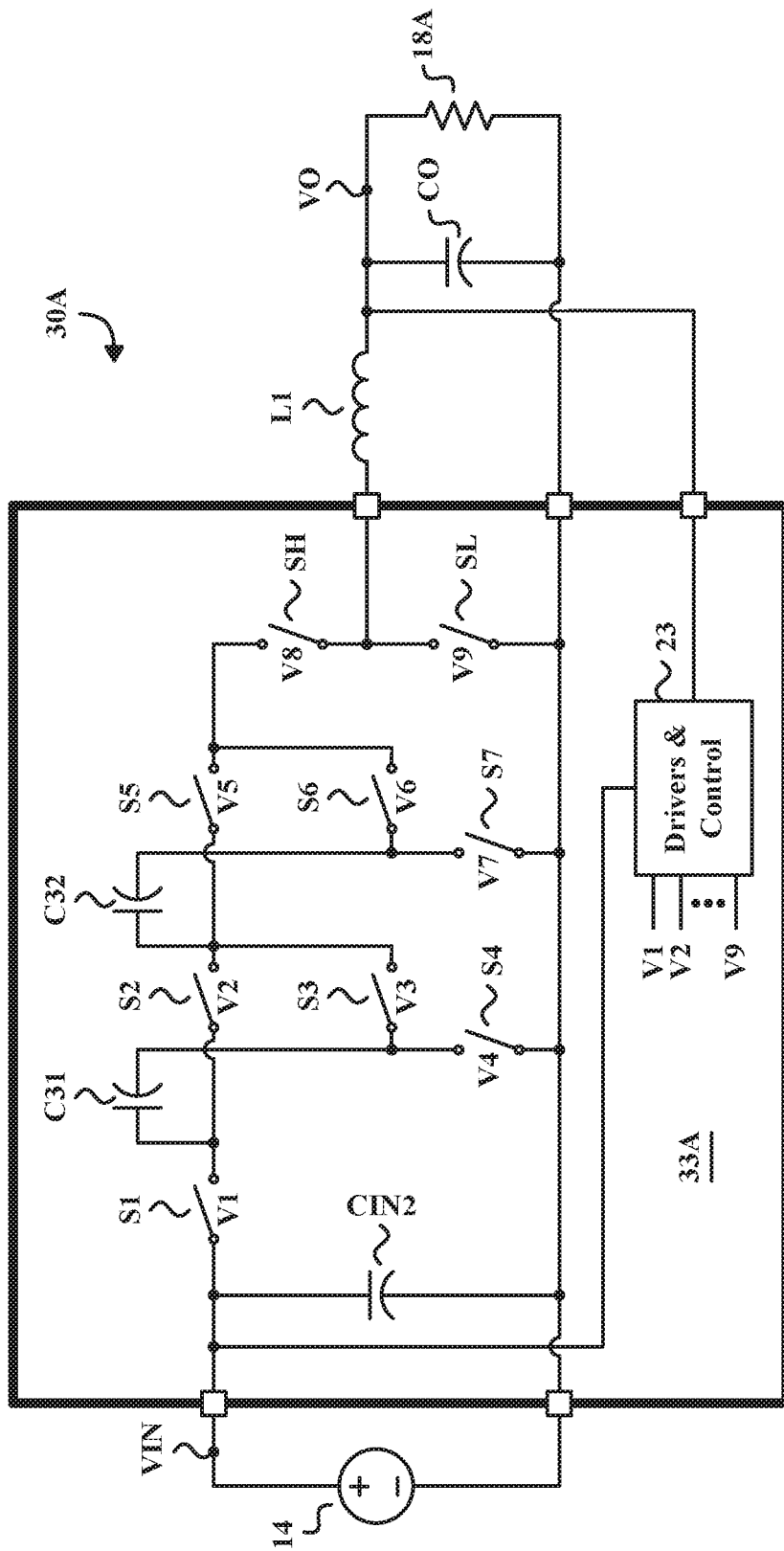
FIG. 3A is a circuit diagram of a power converter with integrated capacitors.

As illustrated in FIG. 3A, the discrete capacitors C21, C22, CIN1 in the power converter 20 are replaced by integrated capacitors C31, C32, CIN2 respectively that are all placed on a passive layer 41A (not shown). Meanwhile, the active devices S1-S7, SL-SH, and control circuit 23 are all included in a separate active layer 42A that would be stacked relative to the passive layer as suggested by FIGS. 2A-2C. The resulting power converter 30A has three fewer discrete capacitors and four fewer pins than the power converter 20.

Figure 3B:
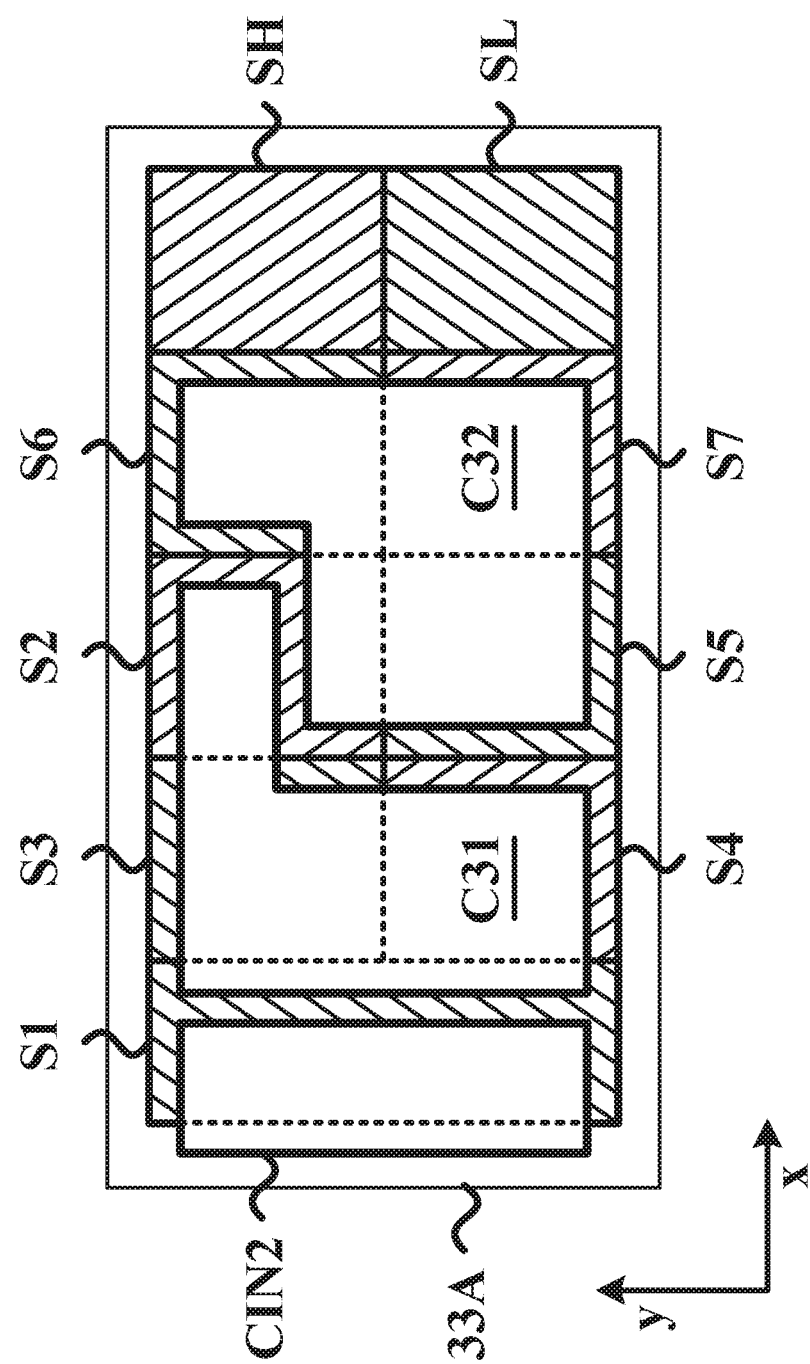
FIG. 3B is a top view of one layout of the power converter whose circuit is shown in FIG. 3A.

A top view of the power converter 30A in FIG. 3B illustrates the disposition of active and passive devices on separate layers coplanar with an xy plane defined by the x and y axes shown and stacked along a z axis perpendicular to the xy plane. The capacitors C31, C32, CIN2 are disposed on a device face of a passive layer over a device face of an active layer, on which are formed active devices S1-S7.

Figure 1C:
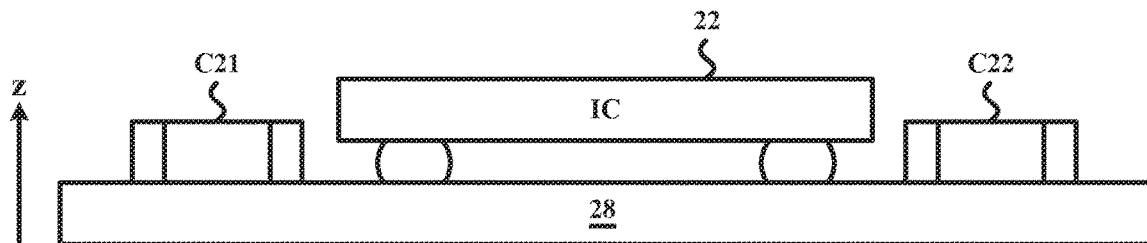
FIG. 1C is a side view of the power converter illustrated in FIG. 1B.
Figure 1D:
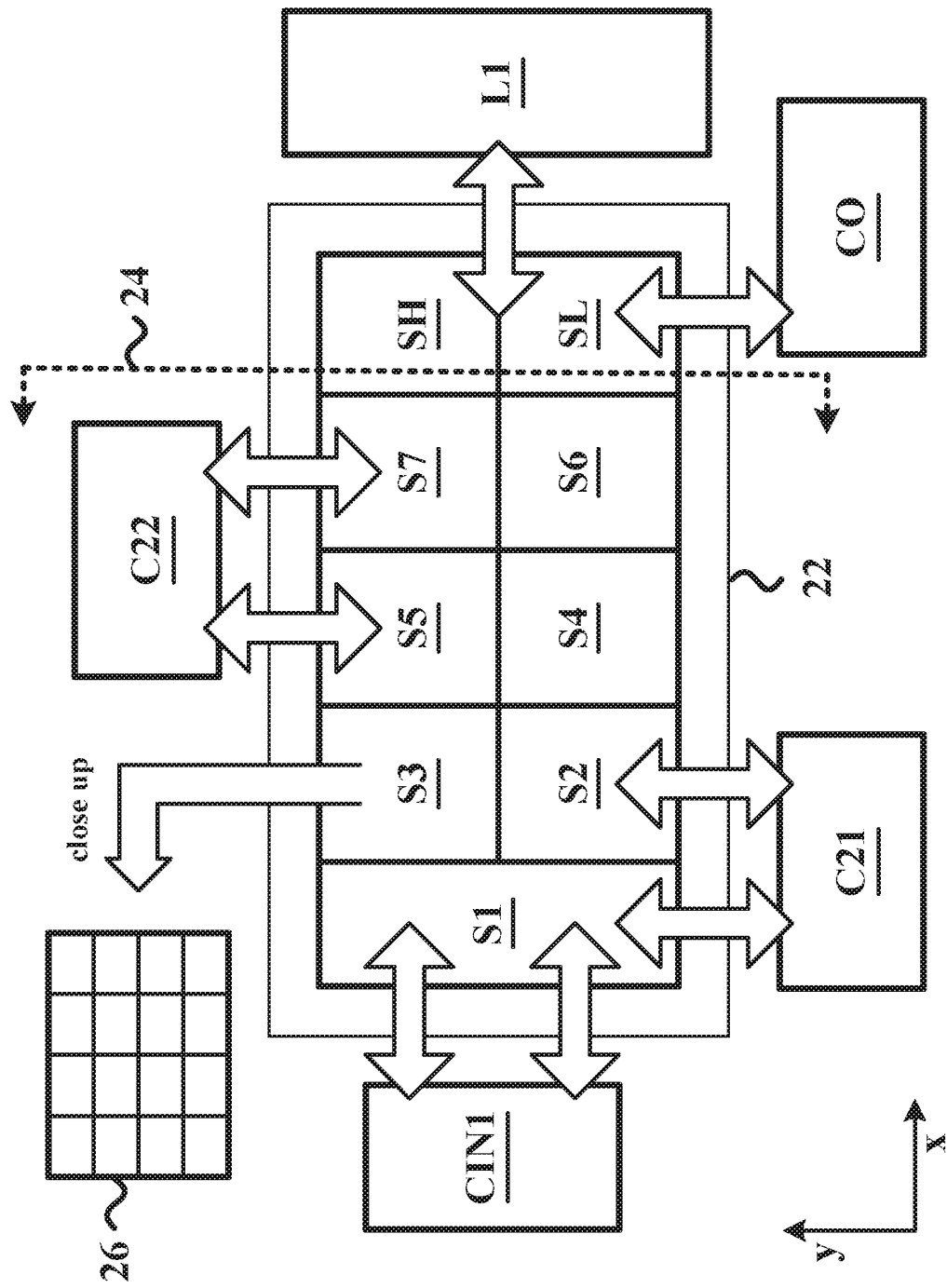
FIG. 1D is a top view of the power converter illustrated in FIG. 1B.

Each capacitor is arranged such that it is directly above the particular active device to which it is to be electrically connected. For example, a first capacitor C31 is directly above switches S1-S4. This is consistent with FIG. 3A, which shows that the positive terminal of the first capacitor C31 is to be connected to first and second switches S1, S2 while the negative terminal of the first capacitor C31 is to be connected to third and fourth switches S3, S4. This arrangement shortens the distance current needs to flow between the active devices and the passive devices in comparison to the arrangement illustrated in FIG. 1B-1D, thereby reducing the energy loss.

FIG. 3B shows another power converter 30B, often referred to as a four-level flying capacitor buck converter. It is a particular implementation of a multi-level buck converter. Other examples include three-level fly capacitor buck converters and five-level capacitor buck converters. Such power converters incorporate a switched-capacitor circuit and can readily be implemented using stacked layers as illustrated in FIGS. 2A-2C.

If the power converter 30B is implemented using the embodiment illustrated in FIG. 2A, then the device stack 33B includes a top active layer 42A and a bottom passive layer 41A. The active devices S31-S36 are included in the active layer 42A, while the fly capacitors C3A-C3B are included in the passive layer 41A. The fly capacitors C3A-C3B are vertically disposed below the active devices S31-S36 to reduce the energy loss in the electrical interconnection.

In operation, the input voltage VIN is chopped using the active devices S31-S36 and the two fly capacitors C3A-C3B. This results in a pulsating voltage at an output node LX. This pulsating voltage is presented to an LC filter represented by a filter inductor L31 and a load capacitor CL, thereby producing an output voltage VO, which is the average of the voltage at the LX node.

Figure 4:
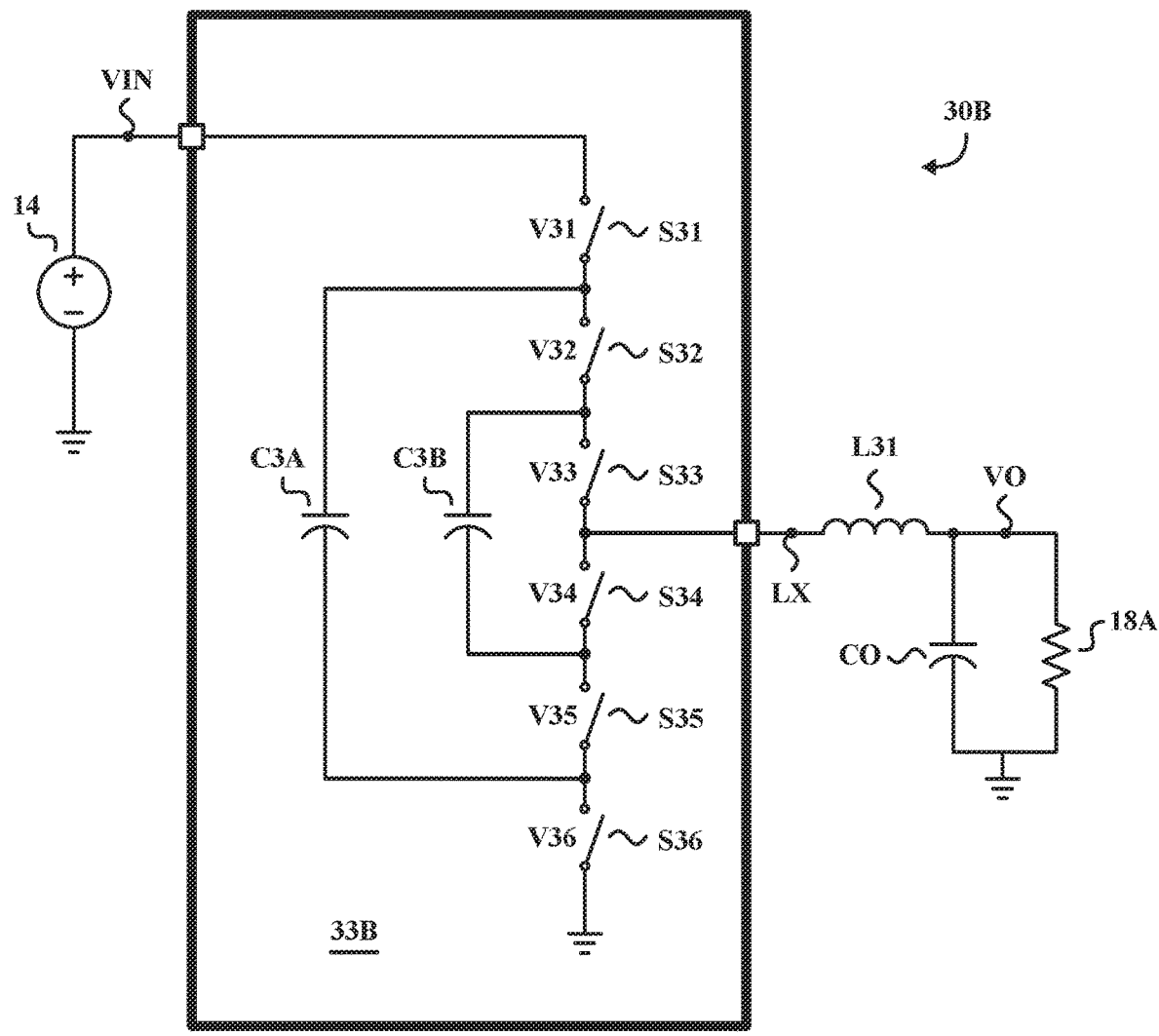
FIG. 4 is a circuit diagram of a four-level buck converter with integrated capacitors.

In the remaining description of FIG. 4, the power converter 30B is assumed to be connected to a 12 volt source 14 and to provide 4 volts to the load 18A. The power converter 30B is in one of eight different states. Depending upon the state, the voltage at the output node LX is 12 volts, 8 volts, 4 volts or 0 volts, assuming that the first fly capacitor C3A is charged to 8 volts and that the second fly capacitor C3B is charged to 4 volts.

The power converter 30B alternates between combinations of the states depending upon the desired output voltage VO. Additionally, the duration of time the power converter 30B is in each state enables regulation of the output voltage VO. It is important to note that the power converter 30B always operates such that the fly capacitors C3A-C3B are charged as much as they are discharged. This maintains a constant average voltage across the fly capacitors C3A-C3B.

Figure 5:
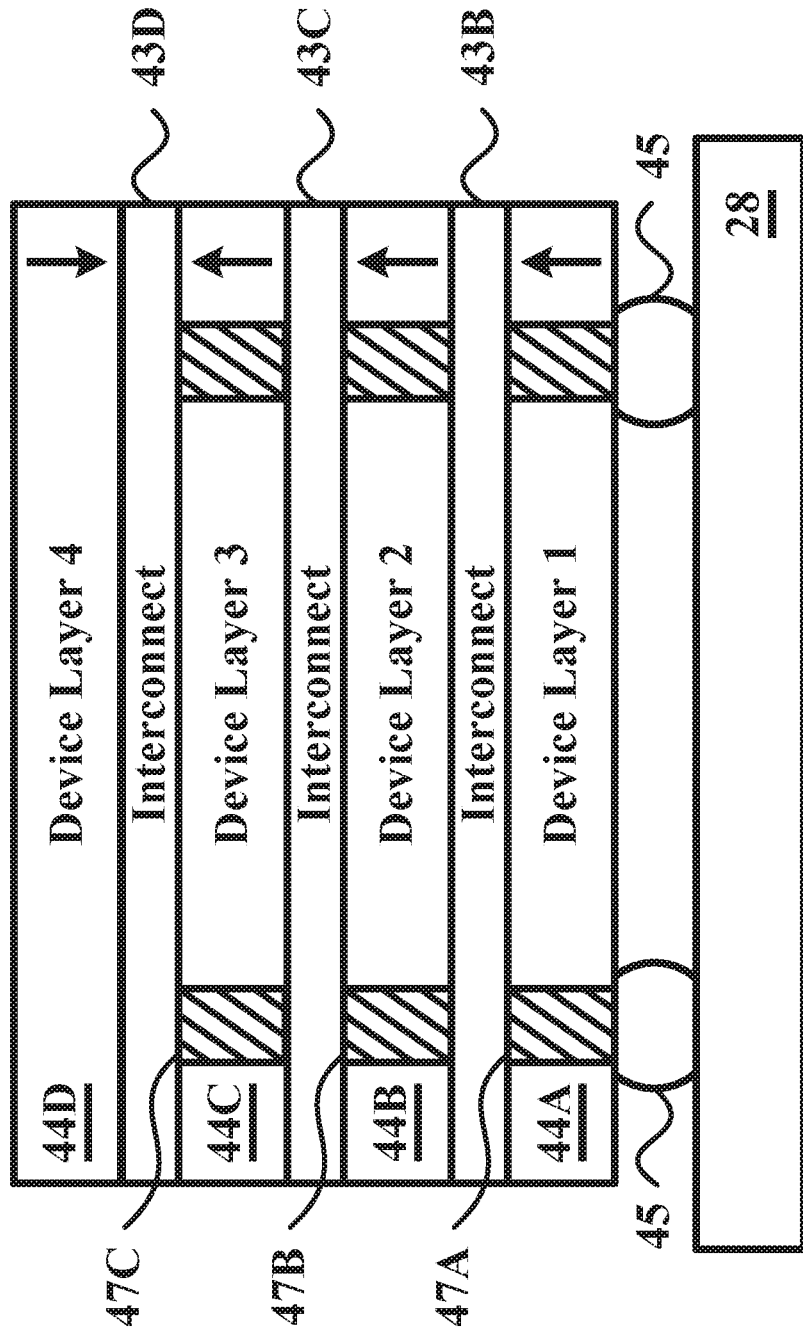
FIG. 5 is a side view of a power converter with generic device layers.

A generalization of the embodiments illustrated in FIGS. 2A-2C is illustrated in FIG. 5, which includes four device layers 44A-44D. In general, at least two device layers are required, one of which includes active devices and the other of which includes passive devices. Typically, the pitch of the interconnect structure 43A-43D is finer than the pitch of the bumps 45, such as solder balls, gold studs, and copper pillars, that couple the power converter to the electrical interface 28. The individual capacitors in the layer with passive devices are sized and arranged so as to fit above or below one or more active devices. Furthermore, the switched capacitor
 elements are also partitioned and laid out in a specific way to reduce parasitic energy loss in the interconnect structures.

Since semiconductor processing is sequential, it is common to only process one side of a wafer. This adds one more dimension to the number of possible permutations. Assuming there is one active layer 42A, one passive layer 41A, one device face per layer, and thru vias 47A, there are a total of eight different ways of arranging the two layers.

FIGS. 6A-6C and FIG. 2A illustrate the four possible combinations in which the passive layer 41A is on top and the active layer 42A is on the bottom. As used herein, a "bottom" layer is the layer closest to the electrical interface and the "top" layer is the layer furthest from the electrical interface.

Figure 6A:
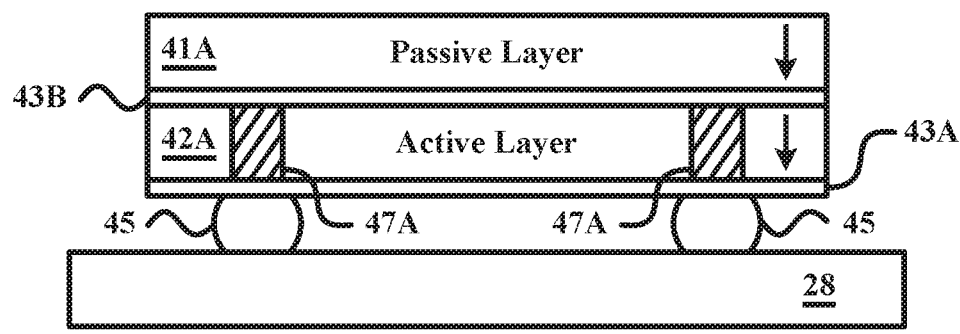
FIGS. 6A-6C are three side views of a power converter in which an active device layer is between a passive device layer and an electrical interface.

In FIG. 6A, the interconnect structure 43A electrically connects the active devices in layer 42A to thru vias 47A and bumps 45. Similarly, the interconnect structure 43B electrically connects the passive devices in layer 41A to thru vias 47A. As indicated by the arrows, the device faces of the passive and active layers 41A, 42A face away from each other.

Figure 6B:
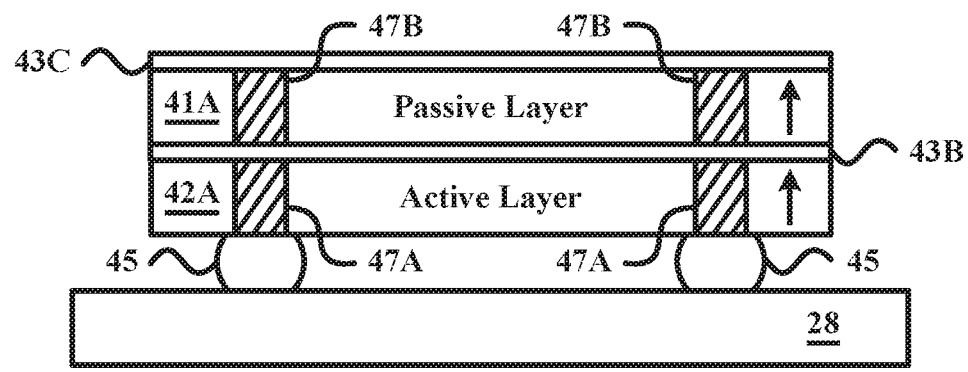

In FIG. 6B, the interconnect structure 43B electrically connects the active devices in layer 42A to thru vias 47A and thru vias 47B. Similarly, the interconnect structure 43C electrically connects the passive devices in layer 41A to thru vias 47B. As indicated by the arrows, the device faces of the passive and active layers 41A, 42A face away from each other.

Figure 6C:
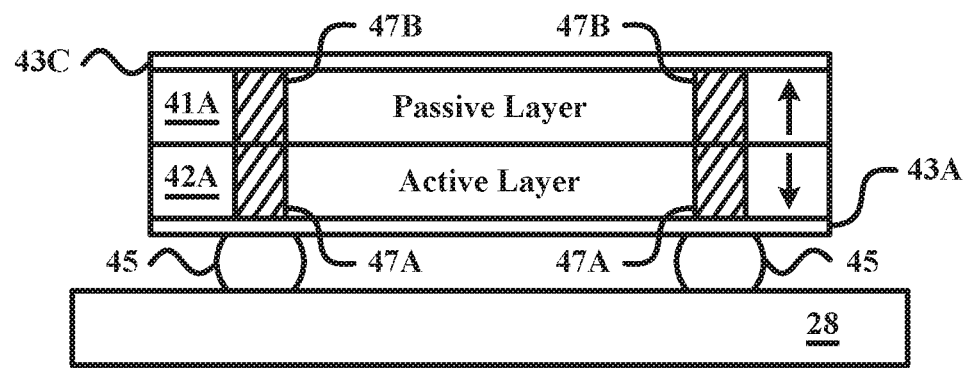

Lastly, in FIG. 6C, the interconnect structure 43A electrically connects the active devices in 42A to thru vias 47A and bumps 45. Similarly, the interconnect structure 43C electrically connects the passive devices in layer 41A to thru vias 47B. As indicated by the arrows, the device faces of the passive and active layers 41A, 42A, face away from each other.

In comparison, FIGS. 6D-6F and FIG. 2B illustrate the four possible combinations in which the active layer 42A is on top and the passive layer 41A is on the bottom.

Figure 6D:
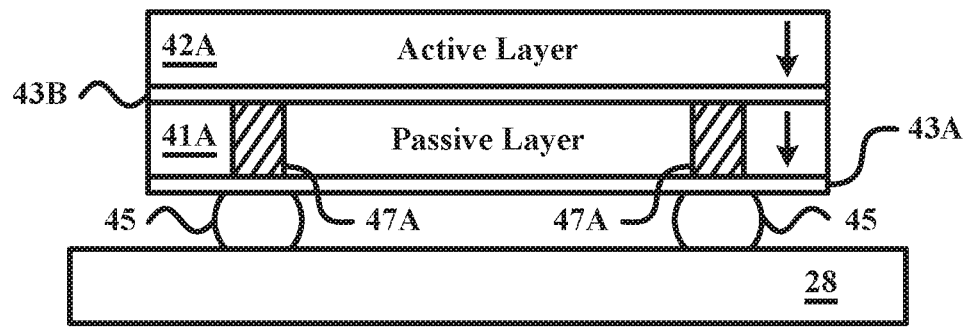
FIGS. 6D-6F are three side views of a power converter in which a passive device layer is between an active layer and the electrical interface.
Figure 6E:
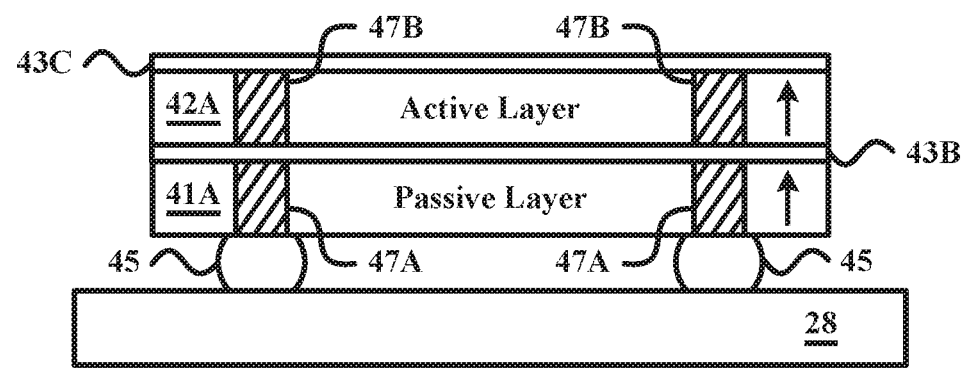
Figure 6F:
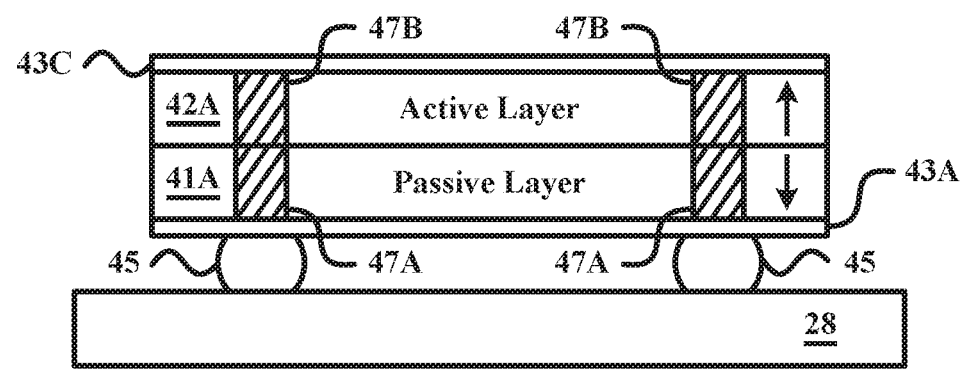

In FIGS. 6D-6F, the active layer 42A and the passive layer 41A are electrically connected together as described in connection with FIGS. 6A-6C. The choice of configuration depends
 upon numerous factors, most of which relate to thru via technology and to the number of pins to the outside world. For example, if there are a larger number of electrical connections between the passive layer 41A and active layer 42A than to the outside world than the configurations illustrated in FIG. 2A & FIG. 2B are more desirable. However, if the opposite is true than the configurations illustrated in FIG. 6A and FIG. 6D are more desirable.

Figure 7A:
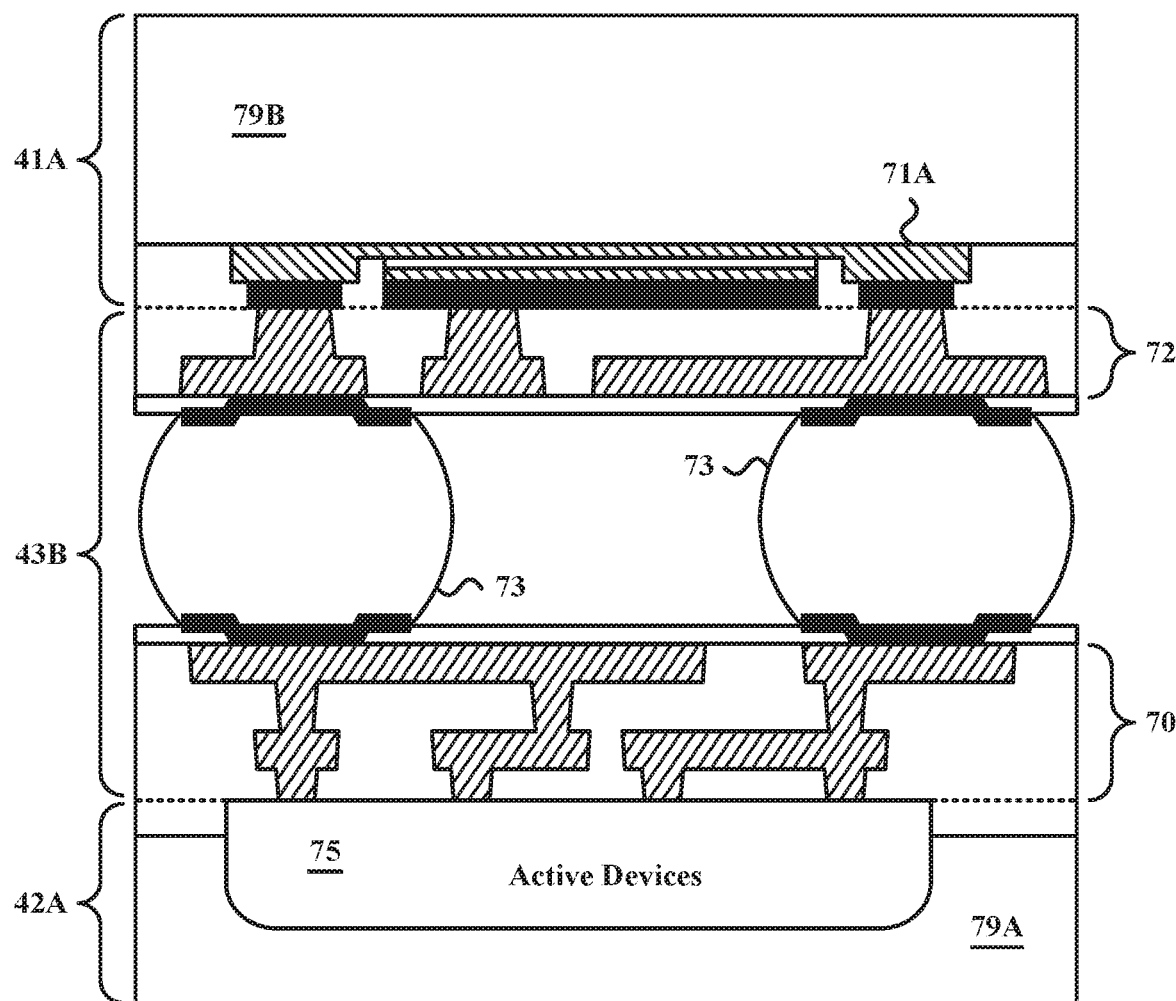
FIG. 7A is a side view of a power converter with a planar capacitor.
Figure 7B:
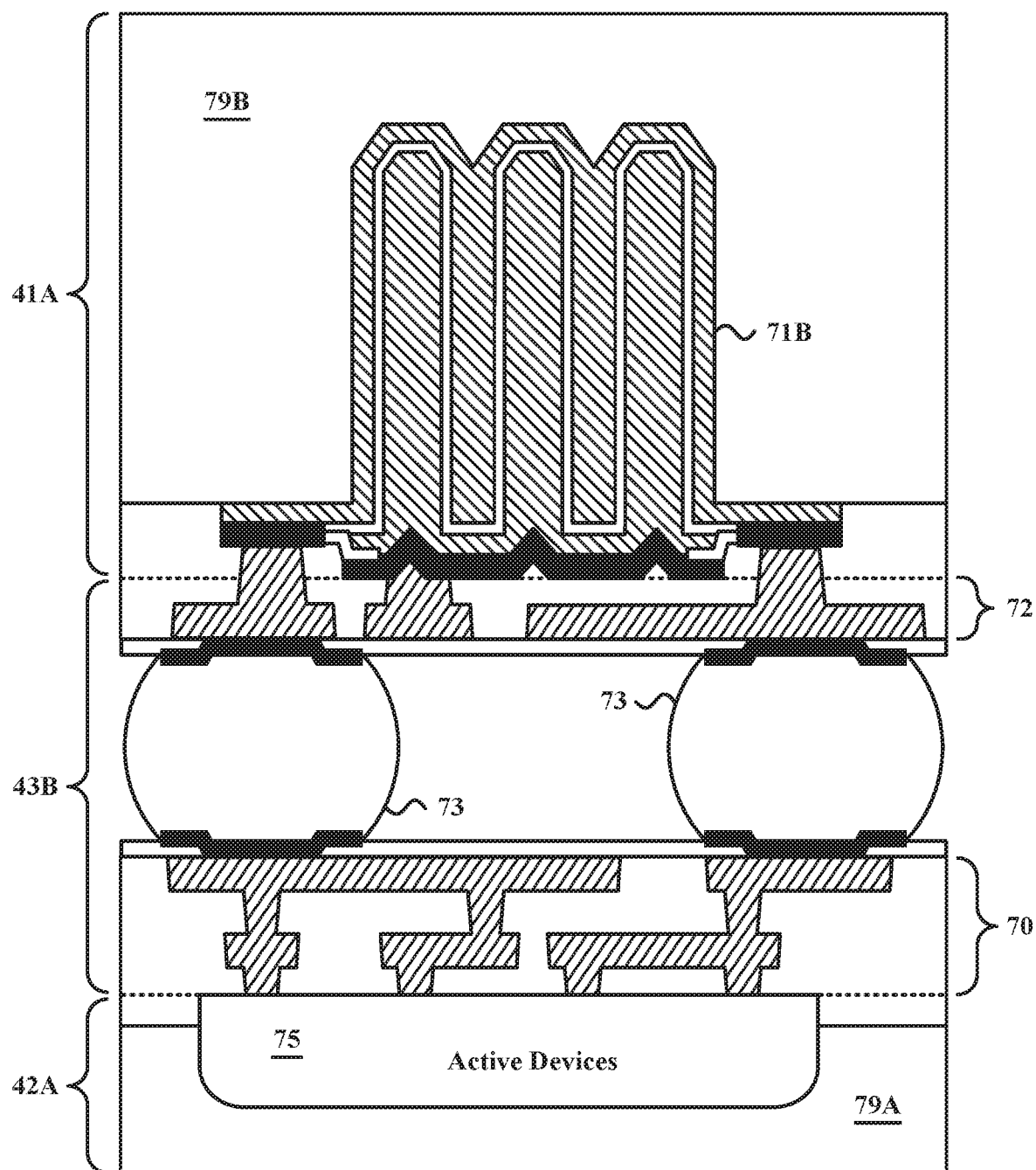
FIG. 7B is a side view of a power converter with a trench capacitor.

The passive substrate and active substrate can be in any form when attached, such as singulated dice or full wafers. Two different implementations that are amenable to die-to-die attachment are shown in FIGS. 7A-7B. Each implementation includes a different type of capacitor.

The capacitors can be of any structure. However, trench capacitors have a capacitance per unit area that is one to two orders of magnitude higher than that of an equivalent planar capacitor, and also have lower equivalent series resistance than equivalent planar capacitors. Both of these capacitor attributes are desirable for use in power converters that use capacitive energy transfer because they favorably affect the efficiency of the power converter.

In the embodiment shown in FIG. 7A, the passive layer 41A includes a planar capacitor 71A and the active layer 42A includes active devices 75. In contrast, the embodiment shown in FIG. 7B, includes a trench capacitor 71B in its passive layer 41A.

The interconnect structure 43B electrically connects the devices within the passive layer 41A to the devices within the active layer 42A. The interconnect structure 43B can be implemented in numerous ways, one of which are illustrated in FIGS. 7A and 7B.

In the case of FIGS. 7A-7B, the interconnect structure 43B is composed of a multilayer interconnect structure 72 on the passive substrate, a single layer of solder bumps 73, and a multilayer interconnect structure 70 on the active substrate.

The bumps 45 are not visible in FIGS. 7A-7B because their pitch on the electrical interface 28 is typically much larger than the interconnect structure 43B. However, to connect to the outside world, some form of connection, such as bumps 45 along with thru vias 47A, is useful.

The bumps 45 can either be located above the passive layer 41A or below the active layer 42A. In the case in which the bumps 45 are located above the passive layer 41A, the thru vias cut 47A through the passive layer 41A as illustrated in FIG. 2B. In the case in which the bumps 45 are located below the active layer 42A, the thru vias 47A cut through the active layer 42A as illustrated in FIG. 2A.

Figure 8A:
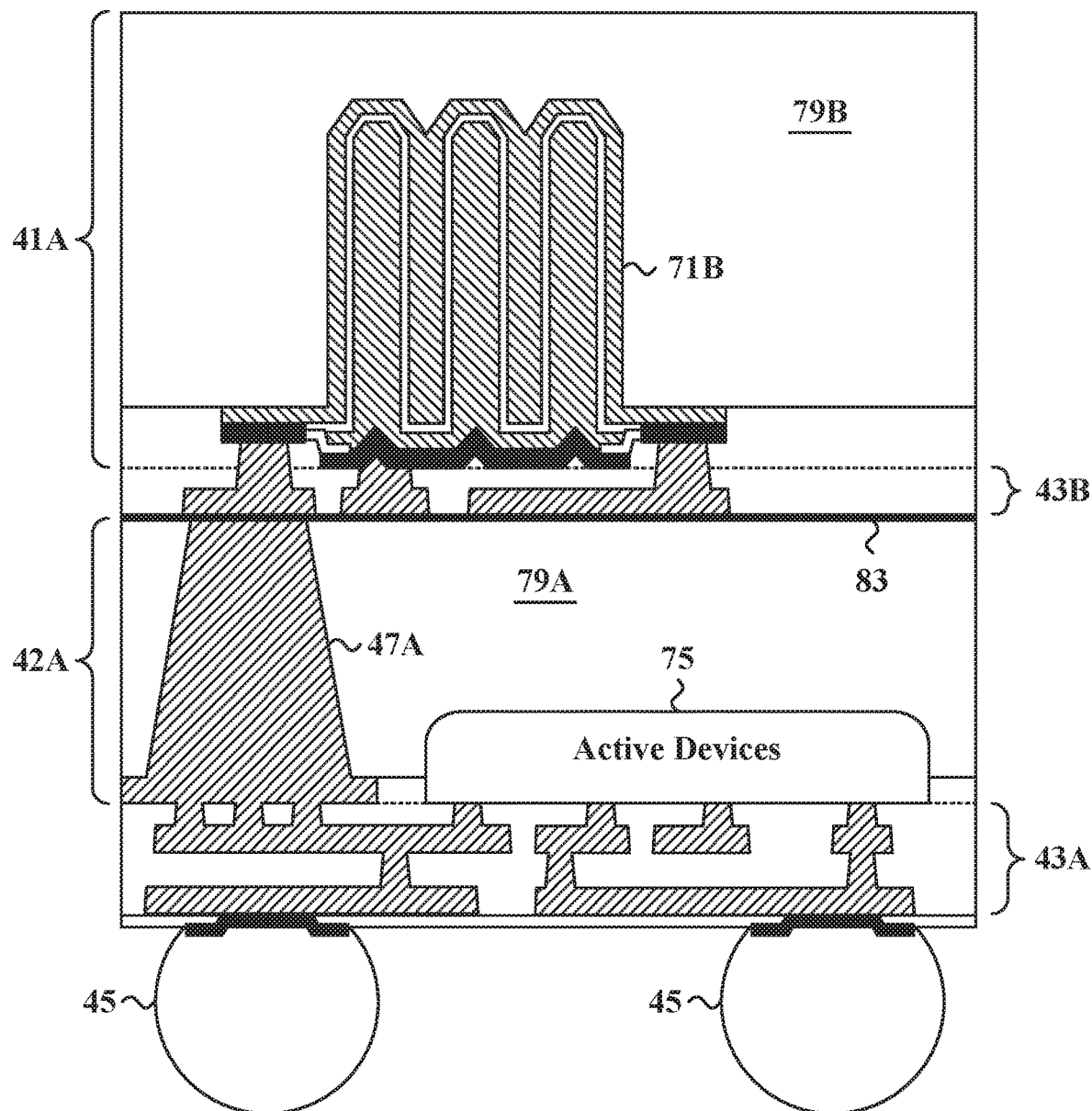
FIG. 8A is a particular implementation of the power converter shown in FIG. 6B.
Figure 8B:
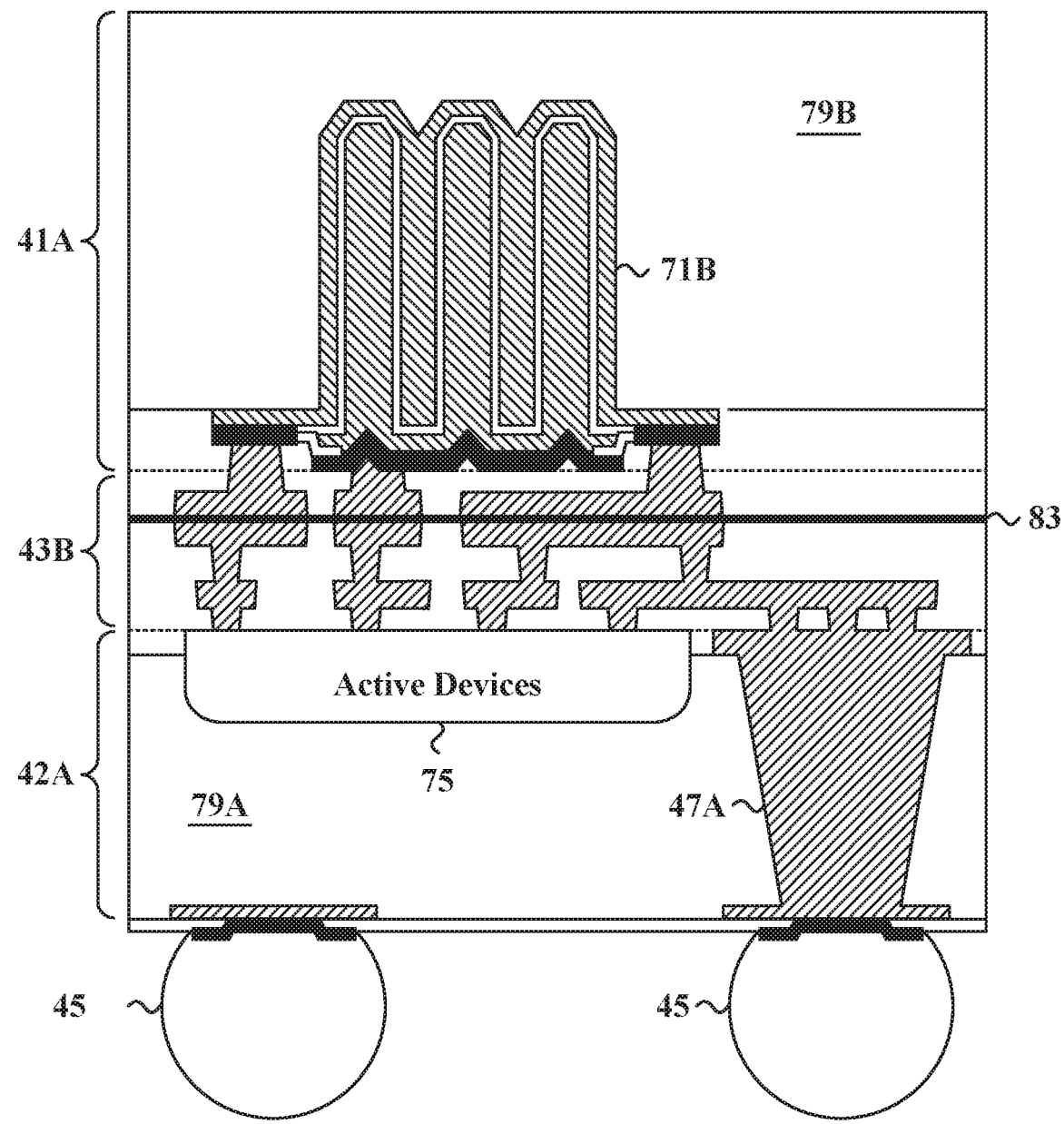
FIG. 8B is a particular implementation of the power converter shown in FIG. 6A.

Embodiments of this invention can also be implemented with wafer-to-wafer stacking as shown in FIGS. 8A-8B. The embodiment illustrated in FIG. 8A is a particular implementation of FIG. 6B, whereas, the embodiment illustrated in FIG. 8B is a particular implementation of FIG. 6A.

The two wafers are electrically connected together using a bonding layer 83 instead of using solder bumps 73 as in the case of FIGS. 7A-7B. There are numerous types of wafer-to-wafer bonding process. Among these are copper-copper bonding, oxide-oxide bonding, and adhesive bonding. Furthermore, FIGS. 8A-8B illustrate the thru vias 47A and their respective bumps 45, which were absent in FIGS. 7A-7B.

Power converters that rely on capacitors to transfer energy generally have complex networks with many switches and capacitors. The sheer number of these components and the complexity of the resulting network make it difficult to create efficient electrical interconnections between switches and capacitors.

Typically, metal layers on an integrated circuit or on integrated passive device are quite thin. Because thin metal layers generally offer higher resistance, it is desirable to prevent lateral current flow. This can be accomplished by controlling the electrical paths used for current flow through the power converter. To further reduce energy loss resulting from having to traverse these electrical paths, it is desirable to minimize the distance the current has to travel. If properly done, significant reductions energy loss in the interconnect structure can be realized. This is accomplished using two techniques.

One way to apply the foregoing techniques to reduce interconnection losses is to partition the switched capacitor element 12A into switched capacitor units operated in parallel, but not electrically connected in parallel. Another way is to choose the shape and location of the switches on the die to fit optimally beneath the capacitors and vice versa.

Figure 9B:
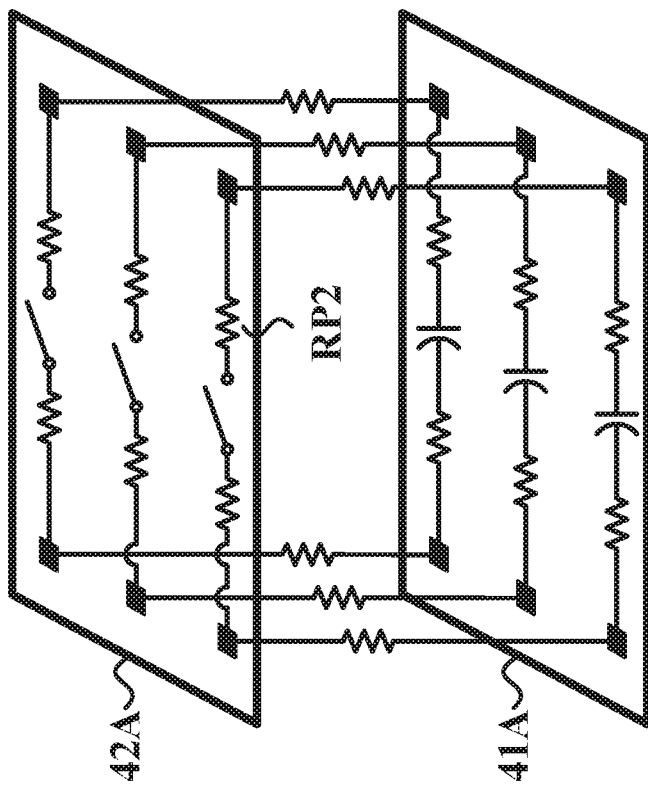
FIG. 9B shows a parasitic network between the active and passive layer with three nodes.
Figure 9A:
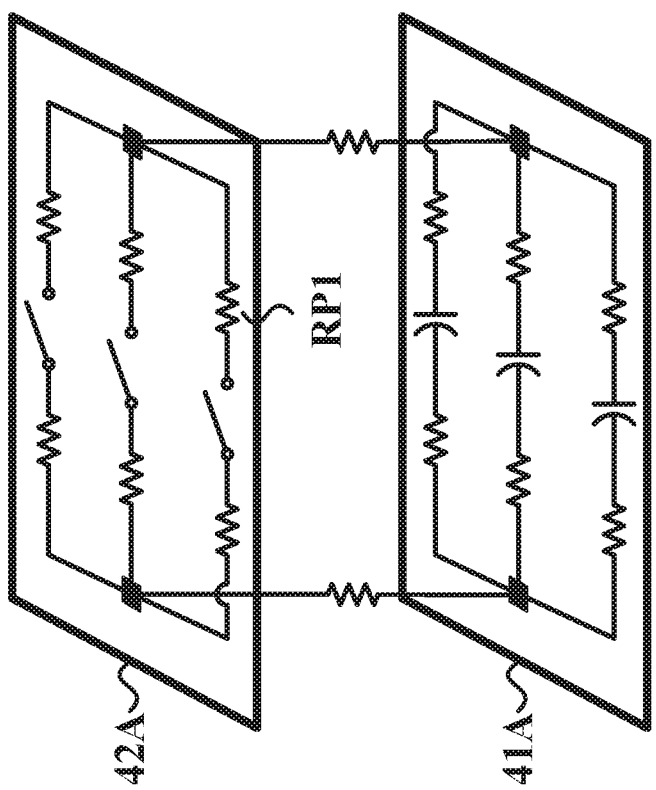
FIG. 9A shows a parasitic network between the active and passive layer with one node.

Partitioning the SC element 12A is effective because it reduces the horizontal current flow that has always been seen as inevitable when routing physically large switches and capacitors to a single connection point or node as depicted in FIG. 9A.

As is apparent from FIG. 9A, current in a physically large component will tend to spread out across the component. To the extent it spreads in the lateral direction, its path through the material becomes longer. This is shown in FIG. 9A by noting the difference between the path length between the two nodes through the center switch and the path length between the two nodes through the lateral switches. This additional path length results in loss, represented in the equivalent circuit by RP1.

By partitioning the component into smaller sections, one can equalize the path length differences between the two nodes, thus reducing associated losses. For example, if the switch and the capacitor in FIG. 9A are partitioned into three sections, the equivalent circuit is approximately that shown in FIG. 9B, in which the lumped resistances associated with the path between nodes is represented by a smaller lumped resistance RP2.

FIGS. 10A-10D illustrate the application of both of these techniques to the implementation of a power converter.

Figure 10A:
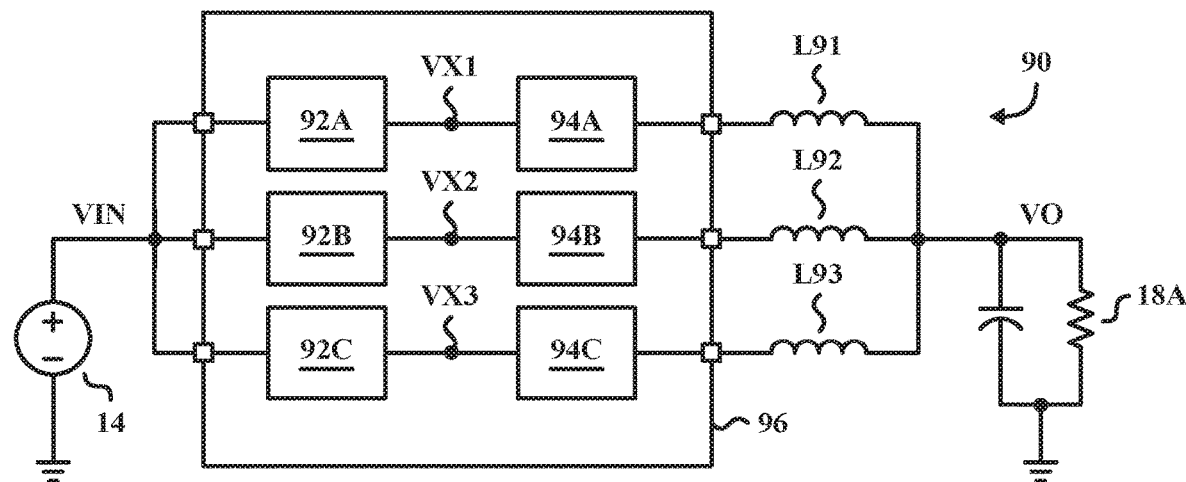
FIG. 10A is a block diagram of a partitioned power converter.

As shown in FIG. 10A, the regulating and switching components of a power converter 90 are partitioned to encourage a more direct electrical path between them, and to minimize any lateral current flow. In the particular example of FIG. 10A, the power converter 90 includes a switched capacitor unit 92A connected to a regulating circuit unit 94A at a first node VX1, a switched capacitor unit 92B connected to regulating circuit unit 94B at a second node VX2, and a switched capacitor unit 92C and regulating circuit unit 94C connected at a third node VX3. Furthermore, first inductor L91, second inductor L92, and third inductor L93 are located at the output of each regulating circuit units 94A-94C. These inductors L91-L93 are then shorted together at the load.

Figure 11:
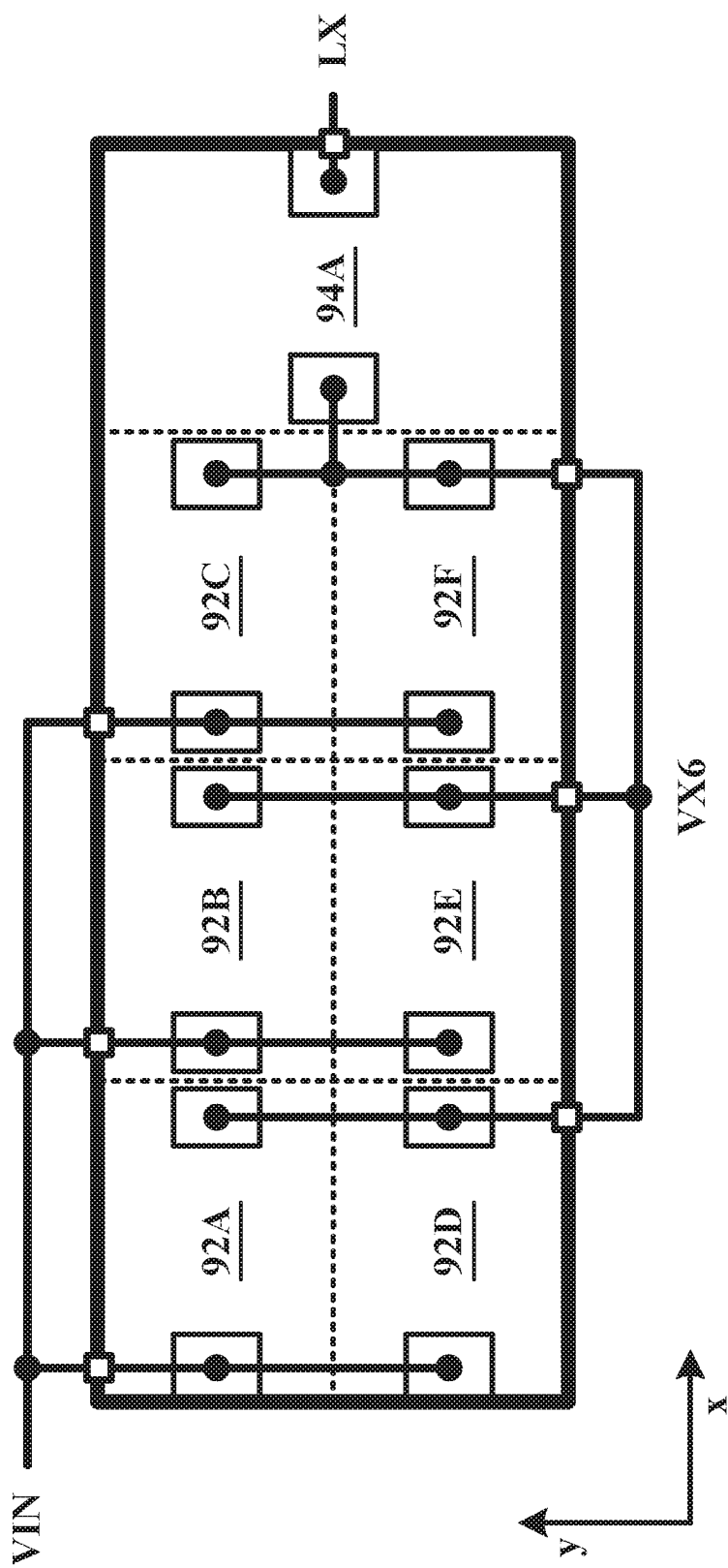
FIG. 11 is a top view of an alternative implementation of the partitioned power converter shown in FIG. 10A.

Although FIG. 10A shows both the regulating circuit 16A and the switching capacitor element 12A as both being partitioned, this is not necessary. It is permissible to partition one and not the other. For example, in the embodiment shown in FIG. 11, only the switching capacitor element 12A has been partitioned. A corollary that is apparent from the embodiment shown in FIG. 11 is that the number of partitions of regulating circuit 16A and the number of partitions of the switched capacitor element 12A need not be the same, as is the case in the particular example shown in FIG. 10A.

Figure 10B:
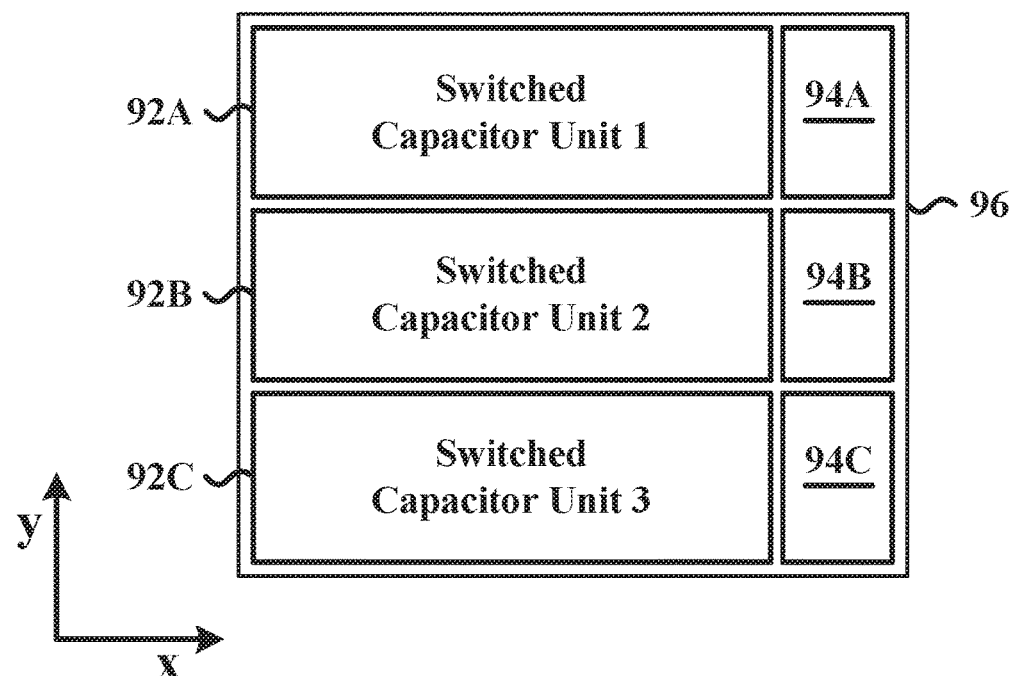
FIG. 10B is a top view of a particular implementation of the partitioned power converter shown in FIG. 10A.

A top view of the power converter 90 shown in FIG. 10A is illustrated in FIG. 10B. The switched capacitor units 92A-92C extend along the y direction, where the first switched capacitor unit 92A is at the top, the second switched capacitor unit 92B is in the middle, and the third switched capacitor unit 92C is at the bottom. The regulating circuit units 94A-94C extend along the y direction as well.

Like the power converter 30A shown in FIGS. 3A-3B, the device stack 96 includes a top passive layer 41A and a bottom active layer 42A. The capacitors within the switched capacitor units 92A-92C are included in the passive layer 41A, whereas the active devices within the switched capacitor units 92A-92C and regulating circuit units 94A-94C are include in the active layer 42A.

Figure 10C:
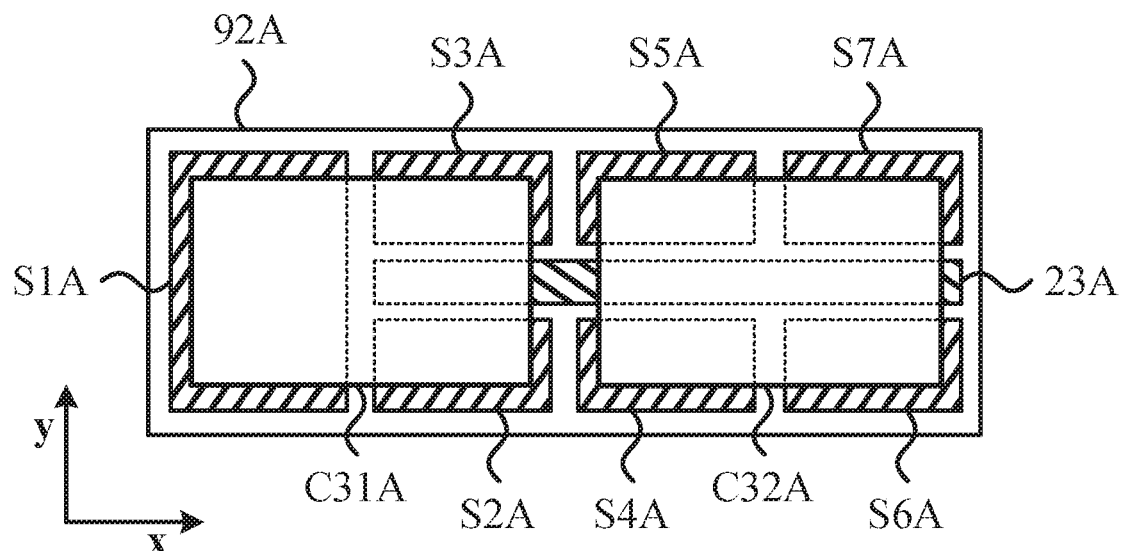
FIG. 10C is a close up of a switched capacitor unit from the partitioned power converter implementation illustrated in FIG. 10B.

As shown in the top view of FIG. 10C, switched capacitor unit 92A includes seven power switches S1A-S7A, two pump capacitors C31A-C31B, and a control/driver circuit 23A. The exact size of the active devices need not be the same size as the passive elements for the first loss-reduction technique to be effective. They simply need to be underneath the passive devices. This arrangement allows for more uniform current distribution and reduced wire length in the interconnect structure of the power converter.

Figure 10D:
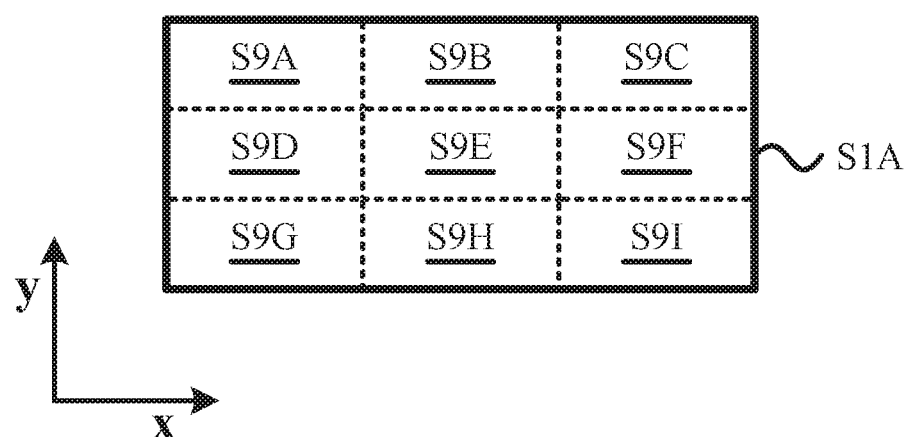
FIG. 10D is a close up of one switch from the switched capacitor unit illustrated in FIG. 10C.

Furthermore, within each switched capacitor unit 92A-92C, the power switches and pump capacitors can be divided up into smaller subunits. This allows for an additional reduction in lateral current flow. An example of the power switch S1A divided up into nine sub units S9A-S9I is illustrated in FIG. 10D.

Since the single monolithic switched capacitor element 12A is divided up into numerous smaller switched capacitor units 92A-92C and placed so as to encourage current in only one direction as shown in FIG. 10B, the equivalent circuit becomes like that in FIG. 9B, thus reducing overall losses.

The technique is effective because the total capacitance increases when capacitors are placed in parallel. For example, this technique is far less effective with inductors because total inductance decreases when inductors are placed in parallel.

Another possible arrangement of the switched capacitor cells is shown in FIG. 11, in which the switched capacitor element is partitioned into small switched capacitor units 92A-92F along both the x and y direction. The exact size and dimensions of the switched capacitor units 92A-92F depend upon many characteristics such as metal thickness, capacitance density, step-down ratio, etc. Both of these techniques reduce the vertical and lateral distance between the switch devices and the passive devices while also providing a uniform current distribution to each individual switch and/or switched capacitor cell. Thus, the parasitic resistance and inductance of the connection between the switches and capacitors is minimized. This is important because the parasitic inductance limits the speed at which the converter can operate and hence its ultimate size while the parasitic resistance limits the efficiency of the power conversion process.

Among other advantages, the arrangements described above avoids the component and pin count penalty, reduces the energy loss in the parasitic interconnect structures and reduces the total solution footprint of power converters that use capacitors to transfer energy.

An apparatus as described herein finds numerous applications in the field of consumer electronics, particularly smart phones, tablet computers, and portable computers. In each of these cases, there are displays, including touch screen displays, as well as data processing elements and/or radio transceivers that consume power provided by the apparatus described herein.

Having described the invention, and a preferred embodiment thereof, what I claim as new, and secured by Letters Patent is:

1. An integrated circuit (IC) comprising:
 a plurality of switched-capacitor partitions configured to be coupled to a plurality of pump capacitors, wherein the plurality of switched-capacitor partitions comprise:
 a first partition comprising:

a first switch; and
a second switch; and
a second partition comprising:
a third switch; and
a fourth switch, wherein the first partition and the second partition are disposed substantially symmetric with respect to an axis.

2. The IC of claim 1, further comprising a fifth switch coupled to the first partition and the second partition.

3. The IC of claim 2, wherein at least one of the first switch, the second switch, the third switch, the fourth switch, and/or the fifth switch comprises a plurality of switch sub-units.

4. The IC of claim 1, further comprising a control circuit coupled to the first partition and the second partition and configured to selectively activate the first switch, the second switch, the third switch, and the fourth switch.

5. The IC of claim 4, wherein the control circuit is disposed between the first partition and the second partition.

6. The IC of claim 5, further comprising a fifth switch disposed adjacent to the first partition, the second partition, and the control circuit, and wherein the fifth switch is coupled to the first partition, the second partition, and the control circuit.

7. The IC of claim 6, wherein a first portion of the fifth switch is on a first side of the axis and a second portion of the fifth switch is on a second side of the axis opposite the first side.

8. The IC of claim 6, wherein each of the first switch, the second switch, the third switch, the fourth switch, and the fifth switch is configured to be coupled to a printed circuit board (PCB) via one or more bumps.

9. The IC of claim 8, wherein the fifth switch and the plurality of switched-capacitor partitions are configured to be coupled to the plurality of pump capacitors via one or more PCB traces and the one or more bumps when the plurality of pump capacitors are coupled to the printed circuit board.

10. The IC of claim 1, wherein the first partition and the second partition are disposed parallel to the axis.

11. The IC of claim 1, wherein the plurality of switched-capacitor partitions configured to be coupled to the plurality of pump capacitors to form a power converter configured to transform a first voltage into a second voltage.

12. The IC of claim 1, wherein:
the first partition further comprises one or more additional switches; and
the second partition further comprises one or more additional switches.

13. The IC of claim 12, wherein:
the first switch and the third switch are disposed substantially symmetric with respect to the axis;
the second switch and the fourth switch are disposed substantially symmetric with respect to the axis; and
each additional switch of the first partition and a corresponding one additional switch of the second partition are disposed substantially symmetric with respect to the axis.

14. The IC of claim 1, wherein at least one of the first switch, the second switch, the third switch, and/or the fourth switch comprises a plurality of switch sub-units.

15. The IC of claim 1, wherein the plurality of switched-capacitor partitions are configured to be coupled to a regulating circuit.

16. A system the IC of claim 1, the system further comprising:
the plurality of pump capacitors coupled to the plurality of switched-capacitor partitions to form a power converter configured to transform a first voltage into a second voltage.

17. The system of claim 16, further comprising a control circuit coupled to the first partition and the second partition and configured to control operation of the first partition and the second partition to implement a plurality of switching arrangements for the power converter to transform the first voltage into the second voltage, wherein the control circuit is disposed between the first partition and the second partition and along the axis.

18. The system of claim 17, further comprising a fifth switch disposed adjacent to the first partition, the second partition, and the control circuit, and wherein the fifth switch is coupled to the first partition, the second partition, and the control circuit.

19. The system of claim 16, further comprising a regulating circuit coupled to the IC.

20. A method of operating the system of claim 16, the method comprising:
setting switching states associated with the first partition and the second partition to implement a plurality of switching arrangements to couple the first partition and the second partition to the plurality of pump capacitors; and
transforming the first voltage into the second voltage based on the setting.

* * * * *

UNITED STATES PATENT AND TRADEMARK OFFICE
CERTIFICATE OF CORRECTION

| | | |
|---|---|---|
| PATENT NO. | : 12,438,135 B2 | Page 1 of 1 |
| APPLICATION NO. | : 18/432387 | |
| DATED | : October 7, 2025 | |
| INVENTOR(S) | : David Giuliano | |

It is certified that error appears in the above-identified patent and that said Letters Patent is hereby corrected as shown below:

In the Specification

In the RELATED APPLICATIONS:

Column 1, Lines 7-8, change "U.S. application Ser. No." to --U.S. Application No.--.

Column 1, Line 10, change "U.S. application Ser. No." to --U.S. Application No.--.

Column 1, Line 12, change "U.S. application Ser. No." to --U.S. Application No.--.

Column 1, Lines 14-15, change "U.S. application Ser. No." to --U.S. Application No.--.

Column 1, Line 17, change "U.S. application Ser. No." to --U.S. Application No.--.

Column 1, Line 19, change "U.S. application Ser. No." to --U.S. Application No.--.

In the BACKGROUND:

Column 3, Line 18, change "and 1n a side view" to --and in a side view--.

Signed and Sealed this
Fourth Day of November, 2025

John A. Squires
*Director of the United States Patent and Trademark Office*